US012591000B2

(12) United States Patent
Shimizu

(10) Patent No.: US 12,591,000 B2
(45) Date of Patent: Mar. 31, 2026

(54) ANALYSIS METHOD, STORAGE MEDIUM, AND MANUFACTURING METHOD OF SEMICONDUCTOR DEVICE

(71) Applicant: FUJI ELECTRIC CO., LTD., Kanagawa (JP)

(72) Inventor: Yusuke Shimizu, Matsumoto-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 722 days.

(21) Appl. No.: 17/954,296

(22) Filed: Sep. 27, 2022

(65) Prior Publication Data

US 2023/0118297 A1　Apr. 20, 2023

(30) Foreign Application Priority Data

Oct. 15, 2021　(JP) ................................. 2021-169381

(51) Int. Cl.
*G01R 31/265* (2006.01)
*H01L 21/66* (2006.01)

(52) U.S. Cl.
CPC .................................. *G01R 31/265* (2013.01)

(58) Field of Classification Search
CPC ........ G01R 31/265; H01L 22/12; H01L 22/20
See application file for complete search history.

(56) References Cited

U.S. PATENT DOCUMENTS

2009/0224284 A1　9/2009　Nemoto
2016/0005622 A1　1/2016　Iwasaki

2017/0301751 A1　10/2017　Agata
2018/0151557 A1*　5/2018　Tanabe ................. H10D 62/393
2022/0084828 A1　3/2022　Yoshida

FOREIGN PATENT DOCUMENTS

| EP | 3675155 | A1 | | 7/2020 |
|---|---|---|---|---|
| EP | 3790040 | A1 | | 3/2021 |
| JP | 2009188336 | A | | 8/2009 |
| JP | 2009302246 | A | * | 12/2009 |
| JP | 2010034281 | A | | 2/2010 |
| JP | 2010092991 | A | | 4/2010 |
| JP | 2012243888 | A | | 12/2012 |
| JP | 2015198166 | A | | 11/2015 |
| JP | 2017098318 | A | | 6/2017 |

(Continued)

OTHER PUBLICATIONS

English Translation of JP2009302246A (Year: 2009).*

*Primary Examiner* — Wyatt A Stoffa
*Assistant Examiner* — Laura Eloise Tandy

(57) ABSTRACT

Provided is an analysis method including acquiring measurement values of a characteristic of a plurality of semiconductor devices of a measurement group in which a concentration of a first impurity and an irradiation amount of a charged particle beam are included in a set range, generating a measurement distribution showing a distribution, in the measurement group, of the measurement values of the characteristic, generating a virtual distribution in which samples of the characteristic are distributed in a range that is wider than the measurement distribution by simulating, based on the measurement distribution, the characteristic of a plurality of the semiconductor devices that is virtual, and calculating a defect rate in the virtual distribution.

22 Claims, 28 Drawing Sheets

S1002, S1004, S1006

(56) References Cited

FOREIGN PATENT DOCUMENTS

| JP | 2019040929 | A  | 3/2019  |
| JP | 2019121657 | A  | 7/2019  |
| JP | 2019192773 | A  | 10/2019 |
| WO | 2014136215 | A1 | 9/2014  |
| WO | 2016157935 | A1 | 10/2016 |
| WO | 2017002619 | A1 | 1/2017  |
| WO | 2021125064 | A1 | 6/2021  |

* cited by examiner

S1002、S1004、S1006

S1008

Eoff DEFECT RATE

CARBON CONCENTRATION $(10^{16}/cm^3)$

| He IRRADIATION AMOUNT $(10^{10}/cm^2)$ | 0 | 0.05 | 0.1 | 0.15 | 0.2 | 0.25 | 0.3 | 0.35 | 0.4 | 0.45 |
|---|---|---|---|---|---|---|---|---|---|---|
| 4 | X00 | X10 | X20 | X30 | X40 | X50 | X60 | X70 | X80 | X90 |
| 5 | X01 | X11 | X21 | X31 | X41 | X51 | X61 | X71 | X81 | X91 |
| 6 | X02 | X12 | X22 | X32 | X42 | X52 | X62 | X72 | X82 | X92 |
| 7 | X03 | X13 | X23 | X33 | X43 | X53 | X63 | X73 | X83 | X93 |
| 8 | X04 | X14 | X24 | X34 | X44 | X54 | X64 | X74 | X84 | X94 |
| 9 | X05 | X15 | X25 | X35 | X45 | X55 | X65 | X75 | X85 | X95 |
| 10 | X06 | X16 | X26 | X36 | X46 | X56 | X66 | X76 | X86 | X96 |

*FIG.13*

Vce DEFECT RATE

| CARBON CONCENTRATION ($10^{16}/cm^3$) | | | | | | | | | | |
|---|---|---|---|---|---|---|---|---|---|---|
| | 0 | 0.05 | 0.1 | 0.15 | 0.2 | 0.25 | 0.3 | 0.35 | 0.4 | 0.45 |
| 4 | Y00 | Y10 | Y20 | Y30 | Y40 | Y50 | Y60 | Y70 | Y80 | Y90 |
| 5 | Y01 | Y11 | Y21 | Y31 | Y41 | Y51 | Y61 | Y71 | Y81 | Y91 |
| 6 | Y02 | Y12 | Y22 | Y32 | Y42 | Y52 | Y62 | Y72 | Y82 | Y92 |
| 7 | Y03 | Y13 | Y23 | Y33 | Y43 | Y53 | Y63 | Y73 | Y83 | Y93 |
| 8 | Y04 | Y14 | Y24 | Y34 | Y44 | Y54 | Y64 | Y74 | Y84 | Y94 |
| 9 | Y05 | Y15 | Y25 | Y35 | Y45 | Y55 | Y65 | Y75 | Y85 | Y95 |
| 10 | Y06 | Y16 | Y26 | Y36 | Y46 | Y56 | Y66 | Y76 | Y86 | Y96 |

He IRRADIATION AMOUNT ($10^{10}/cm^2$)

*FIG.14*

INTEGRATED DEFECT RATE

CARBON CONCENTRATION ($10^{16}/cm^3$)

| | | 0 | 0.05 | 0.1 | 0.15 | 0.2 | 0.25 | 0.3 | 0.35 | 0.4 | 0.45 |
|---|---|---|---|---|---|---|---|---|---|---|---|
| | 4 | Z00 | Z10 | Z20 | Z30 | Z40 | Z50 | Z60 | Z70 | Z80 | Z90 |
| | 5 | Z01 | Z11 | Z21 | Z31 | Z41 | Z51 | Z61 | Z71 | Z81 | Z91 |
| | 6 | Z02 | Z12 | Z22 | Z32 | Z42 | Z52 | Z62 | Z72 | Z82 | Z92 |
| | 7 | Z03 | Z13 | Z23 | Z33 | Z43 | Z53 | Z63 | Z73 | Z83 | Z93 |
| | 8 | Z04 | Z14 | Z24 | Z34 | Z44 | Z54 | Z64 | Z74 | Z84 | Z94 |
| | 9 | Z05 | Z15 | Z25 | Z35 | Z45 | Z55 | Z65 | Z75 | Z85 | Z95 |
| | 10 | Z06 | Z16 | Z26 | Z36 | Z46 | Z56 | Z66 | Z76 | Z86 | Z96 |

He IRRADIATION AMOUNT ($10^{10}/cm^2$)

*FIG.15*

PROBABILITY OF OCCURRENCE

CARBON CONCENTRATION ($10^{16}/cm^3$)

| He IRRADIATION AMOUNT ($10^{10}/cm^2$) | 0 | 0.05 | 0.1 | 0.15 | 0.2 | 0.25 | 0.3 | 0.35 | 0.4 | 0.45 |
|---|---|---|---|---|---|---|---|---|---|---|
| 4 | R00 | R10 | R20 | R30 | R40 | R50 | R60 | R70 | R80 | R90 |
| 5 | R01 | R11 | R21 | R31 | R41 | R51 | R61 | R71 | R81 | R91 |
| 6 | R02 | R12 | R22 | R32 | R42 | R52 | R62 | R72 | R82 | R92 |
| 7 | R03 | R13 | R23 | R33 | R43 | R53 | R63 | R73 | R83 | R93 |
| 8 | R04 | R14 | R24 | R34 | R44 | R54 | R64 | R74 | R84 | R94 |
| 9 | R05 | R15 | R25 | R35 | R45 | R55 | R65 | R75 | R85 | R95 |
| 10 | R06 | R16 | R26 | R36 | R46 | R56 | R66 | R76 | R86 | R96 |

*FIG.16*

CARBON CONCENTRATION $(10^{16}/cm^3)$

S1002、S1004、S1006

S1014

Ices DEFECT RATE

CARBON CONCENTRATION ($10^{16}/cm^3$)

| | | 0 | 0.05 | 0.1 | 0.15 | 0.2 | 0.25 | 0.3 | 0.35 | 0.4 | 0.45 |
|---|---|---|---|---|---|---|---|---|---|---|---|
| He IRRADIATION AMOUNT ($10^{10}/cm^2$) | 4 | W00 | W10 | W20 | W30 | W40 | W50 | W60 | W70 | W80 | W90 |
| | 5 | W01 | W11 | W21 | W31 | W41 | W51 | W61 | W71 | W81 | W91 |
| | 6 | W02 | W12 | W22 | W32 | W42 | W52 | W62 | W72 | W82 | W92 |
| | 7 | W03 | W13 | W23 | W33 | W43 | W53 | W63 | W73 | W83 | W93 |
| | 8 | W04 | W14 | W24 | W34 | W44 | W54 | W64 | W74 | W84 | W94 |
| | 9 | W05 | W15 | W25 | W35 | W45 | W55 | W65 | W75 | W85 | W95 |
| | 10 | W06 | W16 | W26 | W36 | W46 | W56 | W66 | W76 | W86 | W96 |

*FIG.23*

ANALYSIS METHOD, STORAGE MEDIUM, AND MANUFACTURING METHOD OF SEMICONDUCTOR DEVICE

The contents of the following Japanese patent application are incorporated herein by reference:

NO. 2021-169381 filed in JP on Oct. 15, 2021

BACKGROUND

1. Technical Field

The present invention relates to an analysis method, a program, and a manufacturing method of a semiconductor device.

2. Related Art

Conventionally, a technique of forming a recombination center of a carrier by irradiating a semiconductor substrate having formed a semiconductor device such as an Insulated Gate Bipolar Transistor (IGBT) with a charged particle such as a helium ion, and adjusting a lifetime of the carrier, has been known (for example, see Patent document 1 and Patent document 2).

Patent Document 1

Japanese patent application publication No. 2019-121657

Patent Document 2

Japanese patent application publication No. 2009-188336

BRIEF DESCRIPTION OF THE DRAWINGS

FIG. 13 shows an example of a defect rate generated in the defect rate calculating step S1022.

FIG. 14 shows an example of the defect rate generated in the defect rate calculating step S1022.

FIG. 15 shows an example of the defect rate generated in the defect rate calculating step S1022.

FIG. 16 shows a probability of occurrence Rij of each set range.

FIG. 23 shows an example of the defect rate generated in the defect rate calculating step S1022.

DESCRIPTION OF EXEMPLARY EMBODIMENTS

Hereinafter, the present invention will be described through embodiments of the invention, but the following embodiments do not limit the invention according to the claims. In addition, not all of the combinations of features described in the embodiments are necessary to the solving means of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor device is mounted.

In the present specification, a case where a term such as "same" or "equal" is mentioned may include a case where an error due to a variation in manufacturing or the like is included. The error is within, for example, 10%.

In the present specification, a conductivity type of a doping region where doping has been carried out with an impurity is described as a P type or an N type. The N type and the P type are examples of a first conductivity type and a second conductivity type. The N type may be the first conductivity type and the P type may be the second conductivity type, or the P type may be the first conductivity type and the N type may be the second conductivity type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting a conductivity type of the P type.

In the present specification, a description of a P+ type or an N+ type means a higher doping concentration than that of the P type or the N type, and a description of a P– type or an N– type means a lower doping concentration than that of the P type or the N type.

Figure 1:
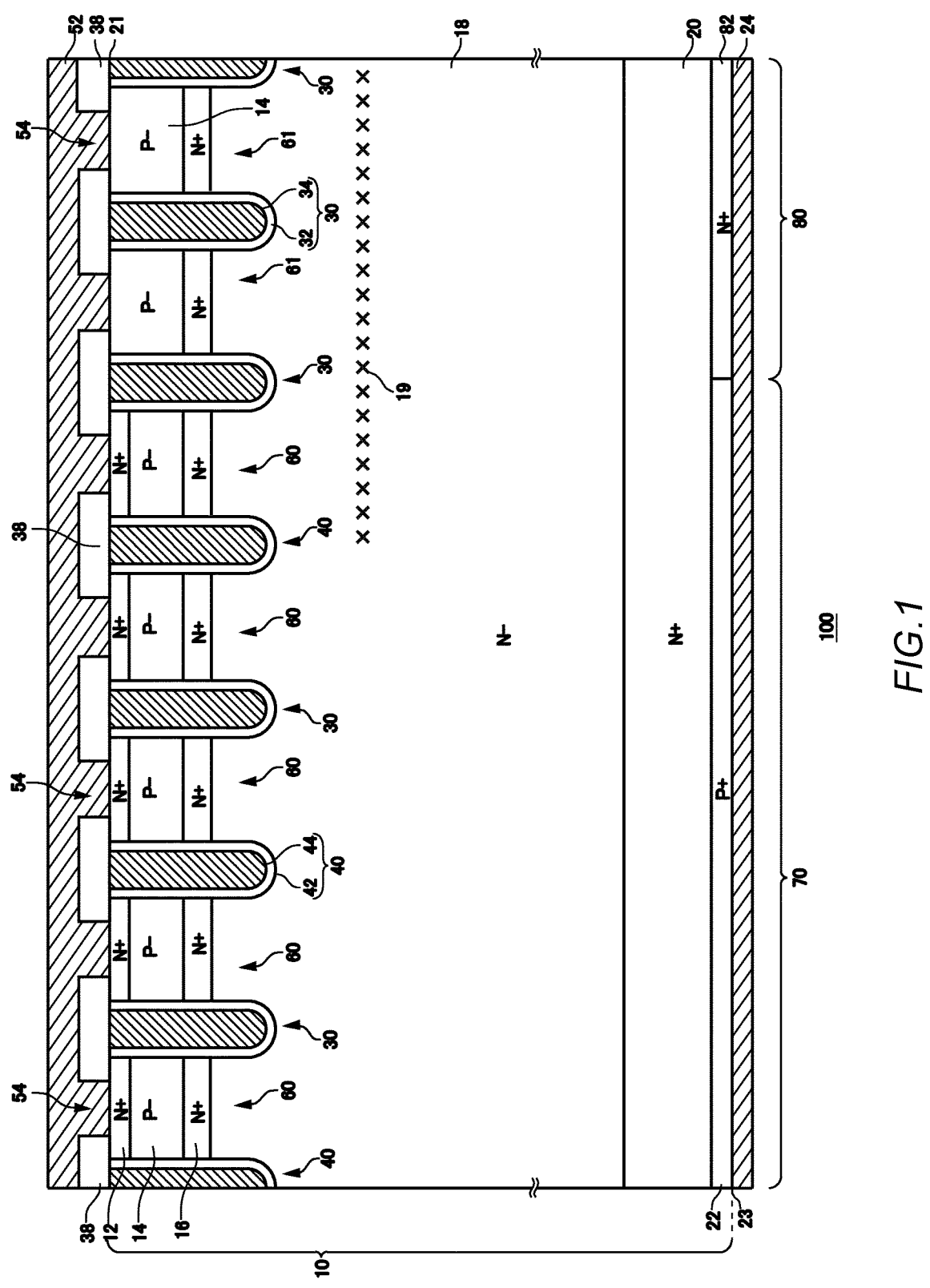
FIG. 1 is a cross-sectional view describing an overview of a semiconductor device 100.

FIG. 1 is a cross-sectional view describing an overview of a semiconductor device 100. The semiconductor device 100 includes at least either of a transistor portion 70 and a diode portion 80. The transistor portion 70 is, for example, an IGBT, but is not limited thereto. The diode portion 80 is, for example, a freewheel diode (FWD) that is anti-parallelly connected to the transistor portion 70, but is not limited thereto. The semiconductor device 100 of the present example is a Reverse Conducting-IGBT (RC-IGBT) that includes the transistor portion 70 and the diode portion 80.

The semiconductor device 100 of the present example includes a semiconductor substrate 10, an insulating film between layers 38, an emitter electrode 52, and a collector electrode 24 in the cross section. The semiconductor substrate 10 is a substrate that is formed of a semiconductor material. As an example, the semiconductor substrate 10 is a silicon substrate. The semiconductor substrate 10 may be a substrate cut out from an ingot manufactured with any of a Czochralski method (CZ method), a magnetic field-applied Czochralski method (MCZ method), or a float zone method (FZ method).

The entire semiconductor substrate 10 may include carbon. The carbon is, for example, an impurity that is added intentionally or unintentionally at the time of manufacture of an ingot. A carbon concentration in the semiconductor substrate 10 is, for example, 0 atoms/cm$^3$ or more and $0.6\times10^{16}$ atoms/cm$^3$ or less, but is not limited thereto.

The semiconductor substrate 10 includes an upper surface 21 and a lower surface 23. The upper surface 21 and the lower surface 23 are two opposingly arranged principal surfaces. The insulating film between layers 38 is provided on the upper surface 21 of the semiconductor substrate 10. The insulating film between layers 38 is a film including at least one layer of an insulating film such as silicate glass to which an impurity such as boron or phosphorous is added, a thermal oxide film, a nitride film, or other insulating films. The insulating film between layers 38 is provided with a contact hole 54 for connecting the emitter electrode 52 and the semiconductor substrate 10.

The emitter electrode 52 is provided on the upper side of the insulating film between layers 38. The emitter electrode 52 is in contact with the upper surface 21 of the semiconductor substrate 10 through the contact hole 54 of the insulating film between layers 38. The emitter electrode 52 may contact an emitter region 12 and a base region 14, which will be described later. The collector electrode 24 is provided on the lower surface 23 of the semiconductor substrate 10. The emitter electrode 52 and the collector electrode 24 are formed of a metal material such as aluminum. In the present specification, the direction in which the emitter electrode 52 is connected to the collector electrode 24 (the Z axis direction) is referred to as a depth direction.

The semiconductor substrate 10 includes an N– type drift region 18. The drift region 18 is provided in each of the transistor portion 70 and the diode portion 80.

The upper surface 21 side of the semiconductor substrate 10 is provided with one or more of gate trench portions 40 and one or more of dummy trench portions 30. The gate trench portion 40 functions as a gate electrode by being applied a gate voltage, whereas a gate voltage is not applied to the dummy trench portion 30 and the dummy trench portion 30 does not function as a gate electrode. In the present specification, the gate trench portion 40 and the dummy trench portion 30 may be referred to as the trench portions. The trench portions are provided in the depth direction of the semiconductor substrate 10 from the upper surface 21 to the drift region 18.

Each of the transistor portion 70 and the diode portion 80 includes one or more trench portions that are arranged in a predetermined array direction at predetermined intervals. In the transistor portion 70 of the present example, one or more gate trench portions 40 and one or more dummy trench portions 30 are alternately provided along the array direction. In the diode portion 80 of the present example, a plurality of the dummy trench portions 30 is provided along the array direction. In the diode portion 80 of the present example, the gate trench portion 40 is not provided.

A mesa portion is provided between each trench portion. The mesa portion refers to a region sandwiched between the trench portions inside the semiconductor substrate 10. As an example, an upper end of the mesa portion is the upper surface 21 of the semiconductor substrate 10. The depth position of a lower end of the mesa portion is the same as the depth position of a lower end of the trench portion. In the present example, a mesa portion 60 is provided in the transistor portion 70, and a mesa portion 61 is provided in the diode portion 80. In the case of simply mentioning "mesa portion" in the present specification, the portion refers to each of the mesa portion 60 and the mesa portion 61.

In the mesa portion 60 of the transistor portion 70, an N+ type emitter region 12 and a P– type base region 14 are provided in order from the upper surface 21 side of the semiconductor substrate 10. The drift region 18 is provided below the base region 14. The mesa portion 60 may be provided with an accumulation region 16. The accumulation region 16 is arranged between the base region 14 and the drift region 18.

The emitter region 12 is exposed on the upper surface 21 of the semiconductor substrate 10 and is provided in contact with the gate trench portion 40. The emitter region 12 may be in contact with the trench portions on both sides of the mesa portion 60. The emitter region 12 includes a higher doping concentration than the drift region 18.

The base region 14 is provided below the emitter region 12. The base region 14 of the present example is provided in contact with the emitter region 12. The base region 14 may be in contact with the trench portions on both sides of the mesa portion 60.

The accumulation region 16 is provided below the base region 14. The accumulation region 16 is an N+ type region with a higher doping concentration than the drift region 18. By providing the accumulation region 16 having a high concentration between the drift region 18 and the base region 14, it is possible to improve a carrier injection enhancement effect (IE effect) and reduce an on-voltage. The accumulation region 16 may be provided to cover an entire lower surface of the base region 14 in each mesa portion 60.

The mesa portion 61 of the diode portion 80 is provided with the P– type base region 14 in contact with the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, an N+ type buffer region 20 may be provided on the lower surface 23 side than the drift region 18. A doping concentration of the buffer region 20 is higher than a doping concentration of the drift region 18. The buffer region 20 may function as a field stop layer which prevents a depletion layer expanding from the lower end of the base region 14 from reaching a P+ type collector region 22 and an N+ type cathode region 82.

In the transistor portion 70, the P+ type collector region 22 is provided below the buffer region 20. An acceptor concentration of the collector region 22 is higher than an acceptor concentration of the base region 14.

Below the buffer region 20 in the diode portion 80, the N+ type cathode region 82 is provided. A donor concentration of the cathode region 82 is higher than a donor concentration of the drift region 18. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

Each trench portion passes through the base region 14 from the upper surface 21 of the semiconductor substrate 10 and reaches the drift region 18. In a region where at least either of the emitter region 12 and the accumulation region 16 is provided, each trench portion also passes through these doping regions and reaches the drift region 18.

The gate trench portion 40 includes a groove-like gate trench provided in the upper surface 21 of the semiconductor substrate 10, a gate insulating film 42, and a gate conductive portion 44. The gate insulating film 42 is provided to cover the inner wall of the gate trench. The gate insulating film 42 may be formed by oxidizing or nitriding a semiconductor on the inner wall of the gate trench. The gate conductive portion 44 is provided inner side from the gate insulating film 42 inside the gate trench. That is, the gate insulating film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the insulating film between layers 38 on the upper surface 21 of the semiconductor substrate 10. The gate conductive portion 44 is electrically connected to a gate wiring. When a predetermined gate voltage is applied to the gate conductive portion 44, a channel is formed by an electron inversion layer in a surface layer of the base region 14 at a boundary surface in contact with the gate trench portion 40.

The dummy trench portions 30 may have the same structure as the gate trench portions 40 in the cross section. The dummy trench portion 30 includes a dummy trench provided in the upper surface 21 of the semiconductor substrate 10, a dummy insulating film 32, and a dummy conductive portion 34. The dummy conductive portion 34 may be electrically connected to the emitter electrode 52.

A recombination center 19 for adjusting a lifetime of a carrier is formed in the semiconductor substrate 10 of the present example. In FIG. 1, the recombination center 19 is schematically shown with an X mark. The recombination center 19 is, for example, a vacancy defect. The recombination center 19 is formed by irradiating the semiconductor substrate 10 with a charged particle such as a helium ion, a proton, or an electron.

The recombination center 19 may be locally formed in the depth direction. In this case, the recombination center 19 can be formed by injecting a charged particle such as a helium ion to a predetermined depth of the semiconductor substrate 10. The concentration (/cm$^3$) of the recombination center 19 can be controlled with an irradiation amount (/cm$^2$) of a charged particle beam. As shown in FIG. 1, the recombination center 19 may be formed on the upper surface 21 side or on the lower surface 23 side of the semiconductor substrate 10. In addition, the recombination center 19 may be formed along the entirety of the depth direction of the semiconductor substrate 10. In this case, a charged particle such as an electron is irradiated so as to pass through the semiconductor substrate 10.

In addition, the recombination center 19 may be locally formed within a surface parallel to the upper surface 21. In this case, a charged particle such as a helium ion is selectively irradiated within the surface by using a mask or the like. For example, the recombination center 19 may be selectively formed in a region of the diode portion 80. The recombination center 19 may be formed in a region of the transistor portion 70. In addition, the recombination center 19 may be formed in both the diode portion 80 and the transistor portion 70.

By forming the recombination center 19, a characteristic of the semiconductor device 100 can be adjusted. For example, a lifetime of a carrier can be adjusted by forming the recombination center 19. In accordance with this, a switching time at turn-off of the semiconductor device 100 can be adjusted, and loss and the like at turn-off can be adjusted. In addition, a saturated voltage Vce_sat (in the present specification, may be simply referred to as the Vce) at the time of an on-state of the semiconductor device 100 varies, and an on-state power loss varies, by forming the recombination center 19. These characteristics vary in accordance with the concentration (/cm$^3$) of the recombination center 19. That is, these characteristics vary in accordance with an irradiation amount (/cm$^2$) per unit area of a charged particle beam irradiated to the semiconductor substrate 10. In addition, since the likelihood of formation of the recombination center 19 varies in accordance with the carbon concentration (/cm$^3$) of the semiconductor substrate 10, a characteristic of semiconductor device 100 also varies in accordance with the carbon concentration of the semiconductor substrate 10.

Whether the semiconductor device 100 is a non-defective product or a defective product may be determined in accordance with the above-described characteristic of the semiconductor device 100. As described above, the characteristic of the semiconductor device 100 varies in accordance with the carbon concentration of the semiconductor substrate 10 and the irradiation amount of the charged particle beam. In the design and manufacture of the semiconductor device 100, it is preferable that a defect rate of the semiconductor device 100 can be accurately estimated for a combination of the carbon concentration of the semiconductor substrate 10 and the irradiation amount of the charged particle beam.

Figure 2:
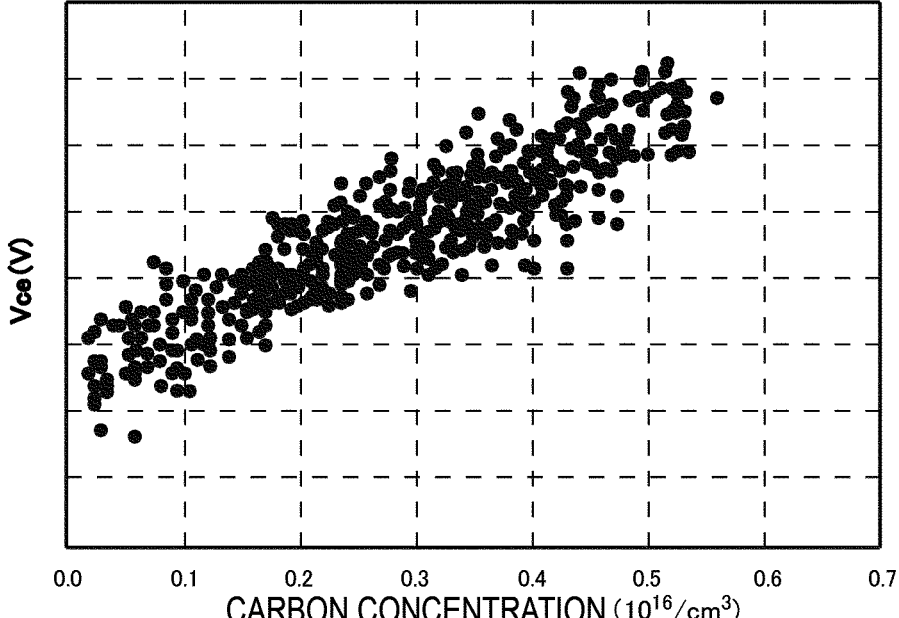
FIG. 2 shows an example of a relationship between a carbon concentration of a semiconductor substrate 10, and a saturated voltage Vce at the time of an on-state.

FIG. 2 shows an example of a relationship between the carbon concentration of the semiconductor substrate 10 and the saturated voltage Vce at the time of an on-state. One plot in FIG. 2 corresponds to one lot of the semiconductor device 100. Each plot shows a relationship between an average of the carbon concentrations of a plurality of the semiconductor devices 100 included in the lot and an average of the saturated voltages Vce.

As shown in FIG. 2, even if the carbon concentrations of the semiconductor substrate 10 are the same, the saturated voltages Vce among the lots have a variation. In each plot of FIG. 2, design parameters other than the carbon concentration are the same. For example, set values of the concentration of an impurity to be injected to the semiconductor substrate 10 and the irradiation amount of the charged particle beam are the same. It should be noted that due to a variation in manufacturing or the like, even if set values of these parameters are the same, variations occur in characteristics such as the saturated voltage Vce. Furthermore, it should be noted that although FIG. 2 shows the saturated voltage Vce, other characteristics such as a carrier lifetime of the semiconductor device 100 are also the same. Thus, even if the distribution shown in FIG. 2 is approximated with a straight line or the like by a linear regression analysis or the like for example, it is difficult to estimate a defect rate of the semiconductor device 100 for a combination of the carbon concentration and the irradiation amount of the charged particle beam.

Figure 3:
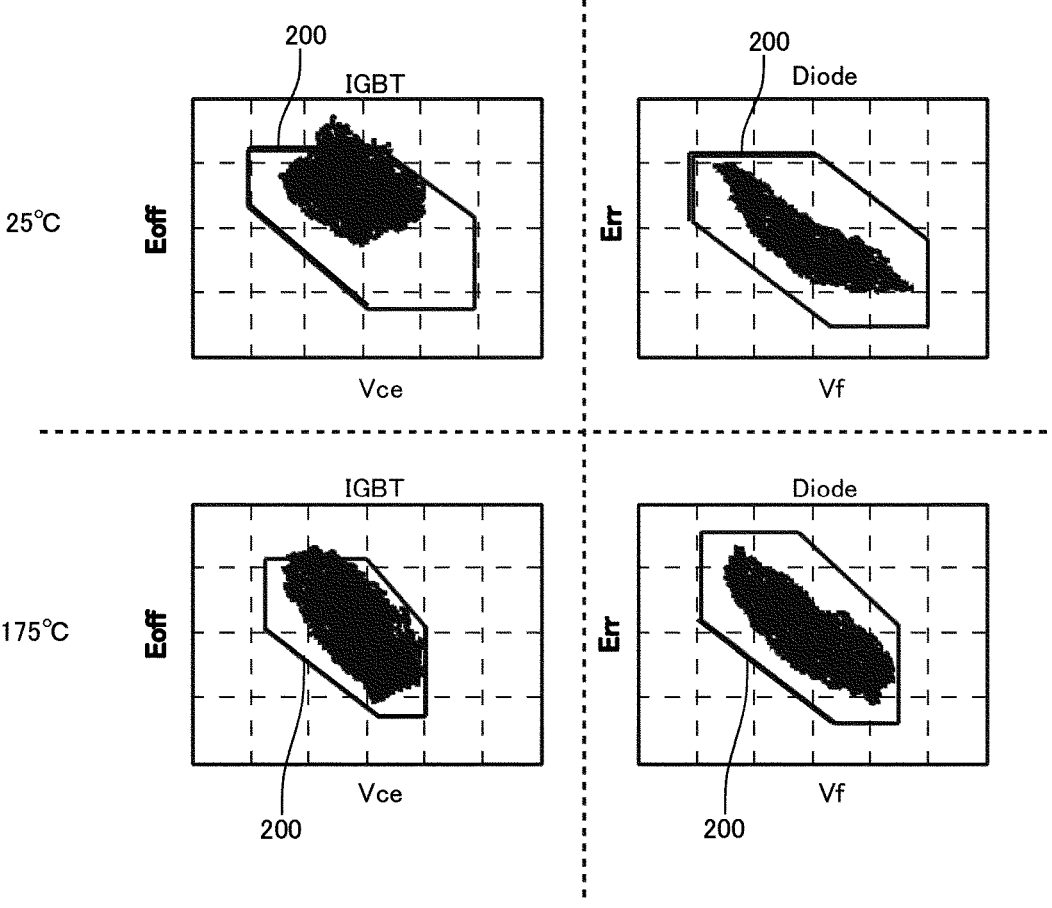
FIG. 3 shows relationships among characteristics of the semiconductor device 100.

FIG. 3 shows relationships among characteristics of the semiconductor device 100. FIG. 3 shows a relationship between a turn-off loss Eoff and a saturated voltage Vce of the transistor portion 70 (IGBT) at 25° C. (in the present specification and the drawings, 25° C. may be referred to as the room temperature or RT) and 175° C., and a relationship between a forward-direction voltage Vf and a reverse recovery loss Err of the diode portion 80 (Diode) at 25° C. and 175° C. It should be noted that, in each distribution chart, one plot corresponds to one lot of the semiconductor device 100. In addition, set values of manufacture parameters such as the carbon concentration and the irradiation amount of the charged particle beam in each plot are the same.

As shown in FIG. 2, even if the carbon concentration and the irradiation amount of the charged particle beam are the same, a variation occurs in each characteristic value. Thus, as shown in FIG. 3, each plot is two-dimensionally distributed. A determination may be made on these plots that, for example, the inner side of a range 200 is non-defective products, whereas the outside is defective products. As shown in FIG. 3, if the shape of the range 200 becomes a polygonal shape such as a pentagon or a hexagon, it would be difficult to accurately estimate the defect rate of the semiconductor device 100 with the linear regression analysis described above.

Figure 4:
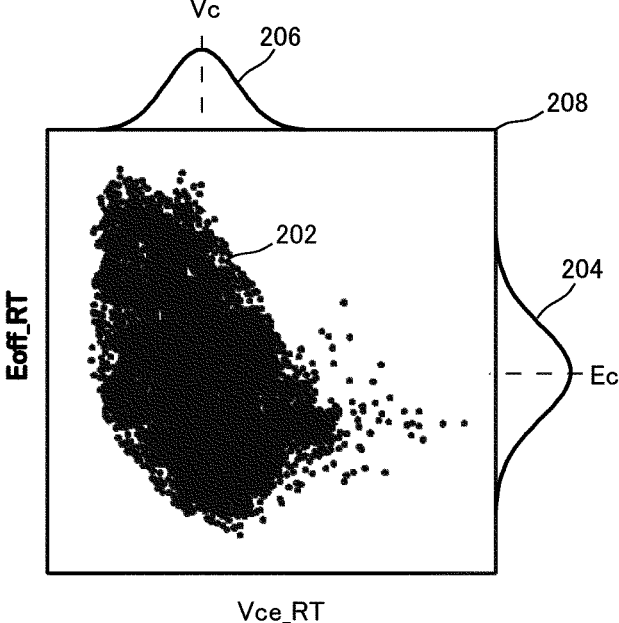
FIG. 4 illustrates an example of a measurement value acquiring step S1002, a measurement distribution generating step S1004, and a shape information acquiring step S1006, in an analysis method according to an embodiment of the present invention.

FIG. 4 illustrates an example of a measurement value acquiring step S1002, a measurement distribution generating step S1004, and a shape information acquiring step S1006, in an analysis method according to an embodiment of the present invention. The analysis method of the present example analyzes the defect rate of the semiconductor device 100 in which the semiconductor substrate 10 includes a first impurity, and the semiconductor substrate 10 is irradiated with a charged particle beam. The first impurity is, for example, carbon, oxygen, nitrogen or the like, but is not limited thereto. The charged particle beam is, for example, a helium ion, a hydrogen ion, or an electron beam, but is not limited thereto. In the present example, the first impurity is carbon, and the charged particle beam is a helium ion.

In the measurement value acquiring step S1002, measurement values of a first characteristic and a second characteristic of a plurality of the semiconductor devices 100 are acquired. In the measurement value acquiring step S1002, a characteristic of the semiconductor device 100 may be measured, or a measurement value that has already been measured may be acquired. The first characteristic and the second characteristic are preferably characteristics that are correlated with each other. The first characteristic and the second characteristic may be characteristics that are trade-off to each other. The first characteristic and the second characteristic may be any two out of the turn-off loss Eoff of the transistor portion 70 at 25° C. or 175° C., the saturated voltage Vce of the transistor portion 70 at 25° C. or 175° C., the forward-direction voltage Vf of the diode portion 80 at 25° C. or 175° C., and the reverse recovery loss Err of the diode portion 80 at 25° C. or 175° C., described in FIG. 3. In the example of FIG. 4, the first characteristic and the second characteristic are a saturated voltage at the room temperature Vce_RT and a turn-off loss at the room temperature Eoff RT. It should be noted that, when the present specification and the drawings describe each characteristic as a saturated voltage, a turn-off loss, or the like without specifying the temperature, the characteristic at the room temperature is referred to. The room temperature may be, for example, any temperature of 15° C. or higher and 30° C. or lower, and may be 27° C. as an example.

In the measurement value acquiring step S1002, measurement values of characteristics of a plurality of semiconductor devices in which the carbon concentration per unit volume in the semiconductor substrate 10 and the irradiation amount of helium ions per unit area of the semiconductor substrate 10 fall within a predetermined set range, are acquired. The carbon concentration and the irradiation amount of helium ions are examples of manufacture condition variables. A measurement value of the carbon concentration of the actual semiconductor substrate 10 may be used, or a specification value of the carbon concentration defined by a manufacturer of the semiconductor substrate 10 may be used, as the carbon concentration of each semiconductor device 100 used in the measurement value acquiring step S1002. In addition, a set value of the irradiation amount of helium ions that is actually irradiated to the semiconductor substrate 10 may be used as the irradiation amount of helium ions used in the measurement value acquiring step S1002.

In the measurement value acquiring step S1002, measurement values of a plurality of the semiconductor devices 100 in which the carbon concentration and the amount of helium irradiation as manufacture condition variables are equivalent, are acquired. In the measurement value acquiring step S1002, the scope of a set range is set such that the carbon concentration and the amount of helium irradiation of the plurality of semiconductor devices 100 included in one measurement group become equivalent. In the analysis method, as shown in FIG. 13 and the like, a defect rate is calculated for one or a plurality of set ranges. Each of the set ranges may be set such that the range of the carbon concentration and the range of the amount of helium irradiation do not overlap with other set ranges. More specifically, in neighboring three set ranges, if a center value of the range of the carbon concentration increases by $0.05 \times 10^{16}/cm^3$ like $0.05 \times 10^{16}/cm^3$, $0.1 \times 10^{16}/cm^3$, $0.15 \times 10^{16}/cm^3$, the width of the range of the carbon concentration in each set range may also be $0.05 \times 10^{16}/cm^3$. The range of the carbon concentration in each set range in this example may be $0.025 \times 10^{16}/cm^3$ to $0.075 \times 10^{16}/cm^3$, $0.075 \times 10^{16}/cm^3$ to $0.125 \times 10^{16}/cm^3$, or $0.125 \times 10^{16}/cm^3$ to $0.175 \times 10^{16}/cm^3$.

In the measurement distribution generating step S1004, a measurement distribution 208 showing a distribution, in one measurement group, of the measurement values of the first characteristic and the second characteristic (in the present example, the saturated voltage Vce and the turn-off loss Eoff) is generated. In the measurement distribution generating step S1004, as shown in FIG. 4, a scatter diagram having the first characteristic and the second characteristic as two axes, may be generated. One plot 202 in FIG. 4 shows one semiconductor device 100. In the measurement distribution generating step S1004, as shown in FIG. 4, a distribution 204 of the first characteristic (Vce) and a distribution 206 of the second characteristic (Eoff) may be generated. The distribution 204 and the distribution 206 are distributions in which a histogram is approximated with a Gaussian distribution. A value of the first characteristic representing a peak in the distribution 204 is denoted by Vc, and a value of the second characteristic representing a peak in the distribution 206 is denoted by Ec. The approximate statistical distribution is not limited to the Gaussian distribution (normal distribution), and well-known statistical distributions in accordance with characteristics and purposes such as a logarithmic normal distribution, a binomial distribution, a Poisson distribution, a chi-squared distribution, or a t distribution may be used.

In the shape information acquiring step S1006, a shape information indicating a shape of the measurement distribution 208, is acquired. In the shape information acquiring step S1006, a shape information indicating a covariance of the first characteristic and the second characteristic in the measurement distribution 208, may be generated. In the shape information acquiring step S1006, a shape information indicating a long-axis vector and a short-axis vector of a distribution of the measurement distribution 208, may be generated. The shape information acquiring step S1006 in the present example generates a variance-covariance matrix of the first characteristic and the second characteristic. The variance-covariance matrix is expressed by Numerical expression 1. $\sigma_l$ is a standard deviation of the distribution 204 of the first characteristic, $\sigma_2$ is a standard deviation of the distribution 206 of the second characteristic, and $\sigma_{12}$ is a covariance of the first characteristic and the second characteristic.

$$\begin{pmatrix} \sigma_1^2 & \sigma_{12} \\ \sigma_{12} & \sigma_2^2 \end{pmatrix}$$

[Numerical expression 1]

Figure 5:
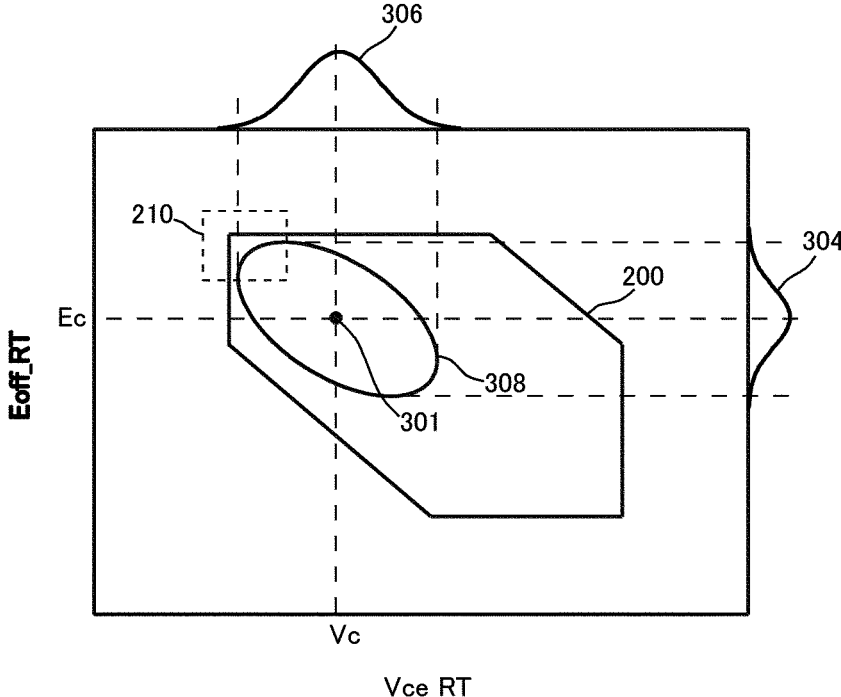
FIG. 5 shows an example of a virtual distribution generating step S1018 and a defect rate calculating step S1022 in the analysis method.

FIG. 5 shows examples of a virtual distribution generating step S1018 and a defect rate calculating step S1022 in the analysis method. In the virtual distribution generating step S1018, the first characteristic and the second characteristic of a plurality of virtual semiconductor devices 100 are simulated based on the measurement distribution 208, and a virtual distribution 308 in which samples of the first characteristic and the second characteristic are distributed in a range that is wider than the measurement distribution 208 is generated.

In the virtual distribution generating step S1018, representative values in the distribution 204 and the distribution 206 may be used to determine a reference point 301 in a plane having the first characteristic and the second characteristic as its two axes. The representative values are, for example, values Vc and Ec representing the peaks of the distribution 204 and the distribution 206, but the representative values are not limited thereto. Any representative value may be used as long as a position of the distribution 204 in the axis of the first characteristic and a position of the distribution 206 in the axis of the second characteristic can be specified.

In the virtual distribution generating step S1018, the virtual distribution 308 in which the samples are distributed in a range that is wider than the measurement distribution 208 is generated by applying the distribution according to the shape of the measurement distribution 208 to the reference point 301. For example, the distribution 304 of the first characteristic (Eoff) and the distribution 306 of the second characteristic (Vce) in the virtual distribution 308 may be a distribution in which tail portions of the distribution 204 and the distribution 206 are broadened to the outer side.

In the virtual distribution generating step S1018, each sample point that is a two-variable normal distribution is generated with a simulation by taking into consideration an information indicating a covariance of the measurement distribution 208 (for example, a variance-covariance matrix). As an example, in the virtual distribution generating step S1018, a Monte Carlo simulation is performed based on a virtual distribution formed from parameters such as a variance, a covariance, and an average value. In the virtual distribution generating step S1018, the virtual distribution 308 having a larger number of samples than the measurement distribution 208 may be generated. In this manner, in the virtual distribution 308, samples are likely to distribute in a range that is wider than the measurement distribution 208.

In the defect rate calculating step S1022, whether each sample point included in the virtual distribution 308 is within the predetermined range 200 is determined. A defect rate is calculated by regarding sample points existing outside the range 200 as defective samples. The definition of the defect rate is a value obtained by dividing the number of defects with the amount of manufacture. Although the virtual distribution 308 is schematically shown as an ellipse in FIG. 5, the virtual distribution 308 is a collection of many sample points.

Figure 6:
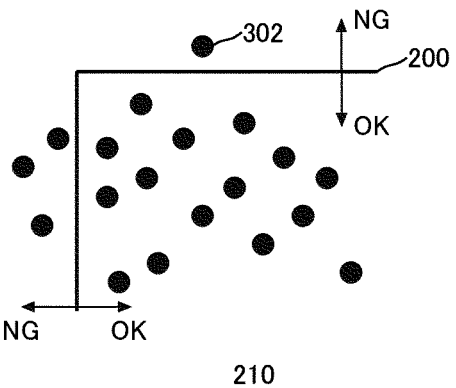
FIG. 6 is an enlarged view of a region 210 in FIG. 5.

FIG. 6 is an enlarged view of a region 210 in FIG. 5. In FIG. 6, sample points 302 of the virtual distribution 308 are shown with black circles. In the defect rate calculating step S1022, the sample points 302 existing outside the range 200 are determined as defective samples. According to the present example, the defect rate is calculated by generating the virtual distribution 308 having a range that is wider than the measurement distribution 208. Thus, the defect rate can be accurately calculated even from the measurement distribution 208 having a relatively small number of samples.

FIG. 4 to FIG. 6 described a calculation method of the defect rate in one set range. In the analysis method, defect rates in a plurality of set ranges may be calculated. In this case, a shape (for example, a variance-covariance matrix) of the measurement distribution 208 in a certain set range may be applied to the virtual distribution 308 in another set range. In addition, the analysis method may use measurement values of a plurality of measurement groups to calculate a defect rate in each set range.

Figure 7:
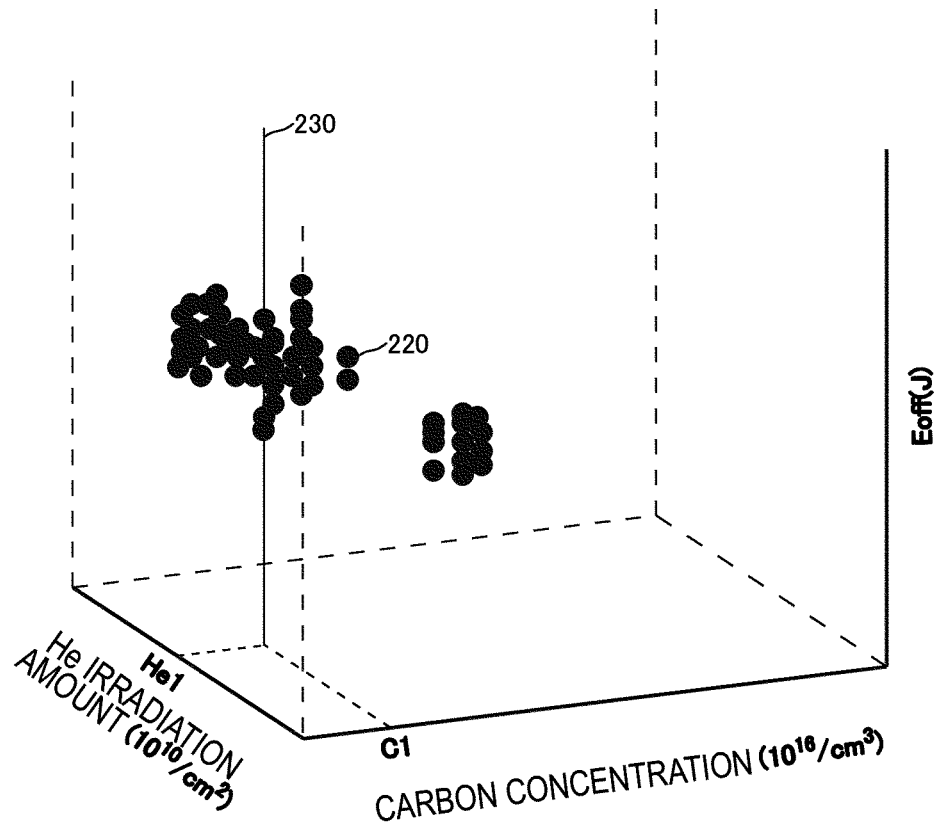
FIG. 7 shows an example of a distribution, in each measurement group, of a group representative value 220 of a first characteristic (Eoff).

FIG. 7 shows an example of a distribution, in each measurement group, of a group representative value 220 of the first characteristic (Eoff). As described above, one measurement group includes the plurality of semiconductor devices 100 in which the carbon concentration and the irradiation amount of the charged particle are within a predetermined set range. It should be noted that a plurality of measurement groups may also exist for a same set range. The measurement groups may be grouped according to periods of manufacture, manufacture lots, or other indications. Although FIG. 7 and the following drawings may describe processing contents by using the group representative value 220 of the first characteristic, a group representative value of the second characteristic (Vce) is also processed in the same manner as the processing described in FIG. 7 and the like.

An average value of the first characteristic of each semiconductor device 100 in the measurement group may be used as the group representative value 220. It should be noted that the group representative value 220 is not limited to the average value. Any group representative value 220 may be used as long as it can define the on-axis position of the first characteristic of the measurement distribution 208 in the measurement group. For example, the group representative value 220 may be a value Ec of the first characteristic representing the peak of the distribution 204.

As shown in FIG. 7, the group representative value 220 may not exist for all the combinations of carbon concentrations and amounts of helium irradiation as manufacture condition variables, but exists for a specific combination of a carbon concentration and an amount of helium irradiation. That is, if a plane having the carbon concentration and the amount of helium irradiation as its two axes is divided into a plurality of set ranges, there are a set range in which the group representative value 220 exists and a set range in which the group representative value 220 does not exist. The measurement group may be a collection of the semiconductor devices 100 manufactured in the past. In this case, for combinations of carbon concentrations and amounts of helium irradiation not used in the manufacture, a measurement group does not exist and thus the group representative value 220 is not acquired. In the analysis method of the present example, a defect rate is estimated also for a set range in which the group representative value 220 is not acquired.

Figure 8:
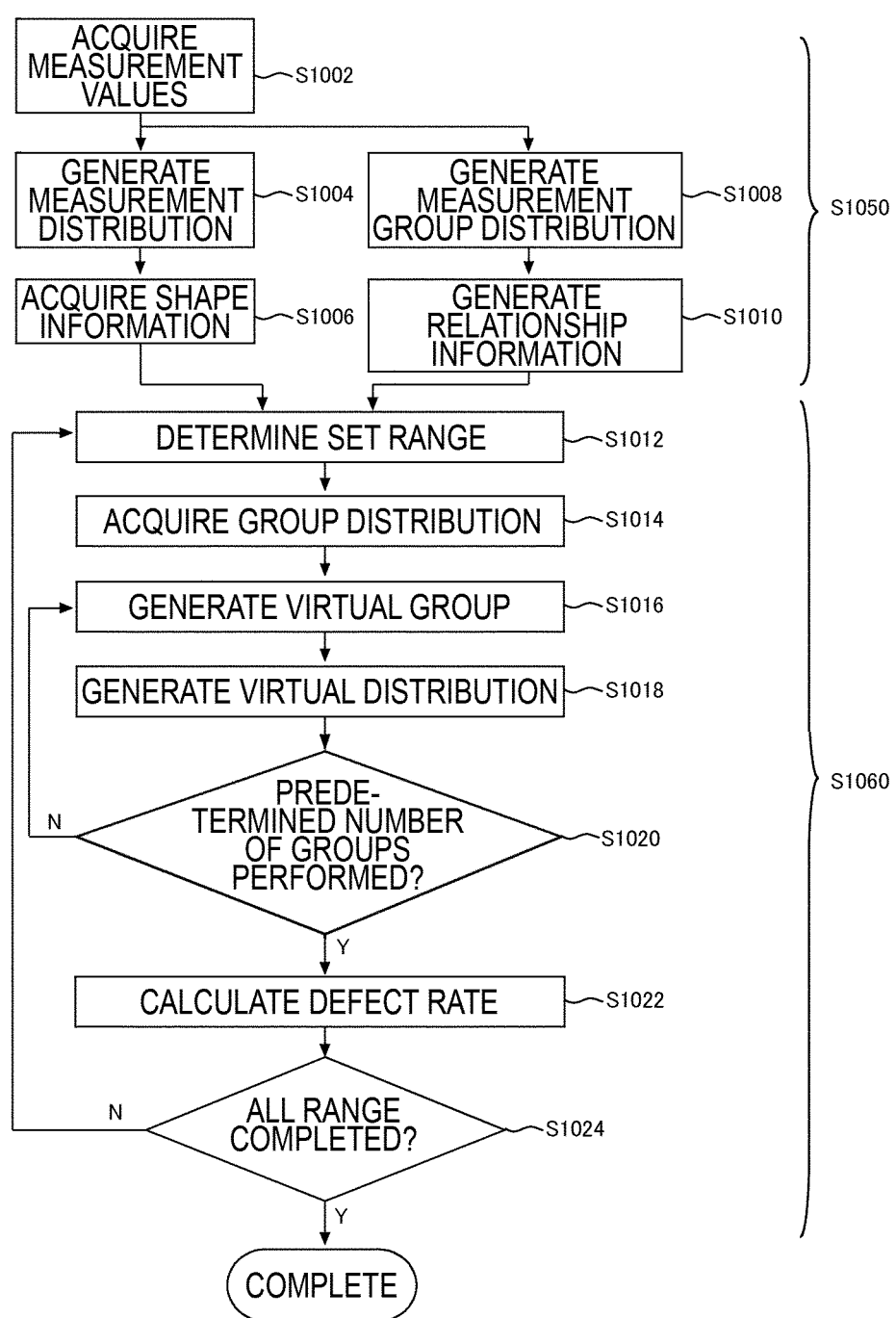
FIG. 8 is a flowchart showing an embodiment of the analysis method.

FIG. 8 is a flowchart showing an embodiment of the analysis method. The analysis method includes a preparing step S1050 and a processing step S1060. The preparing step S1050 includes the measurement value acquiring step S1002, the measurement distribution generating step S1004, the shape information acquiring step S1006, a measurement group distribution generating step S1008, and a relationship information generating step S1010.

The measurement value acquiring step S1002, the measurement distribution generating step S1004, and the shape information acquiring step S1006 are the same as the measurement value acquiring step S1002, the measurement distribution generating step S1004, and the shape information acquiring step S1006 described in FIG. 4. In the present example, the measurement value acquiring step S1002, the measurement distribution generating step S1004, and the shape information acquiring step S1006 are performed for at least one set range in which the group representative value 220 exists. The measurement value acquiring step S1002, the measurement distribution generating step S1004, and the shape information acquiring step S1006 may be performed for a plurality of or all of set ranges in which the group representative value 220 exists.

Figure 9:
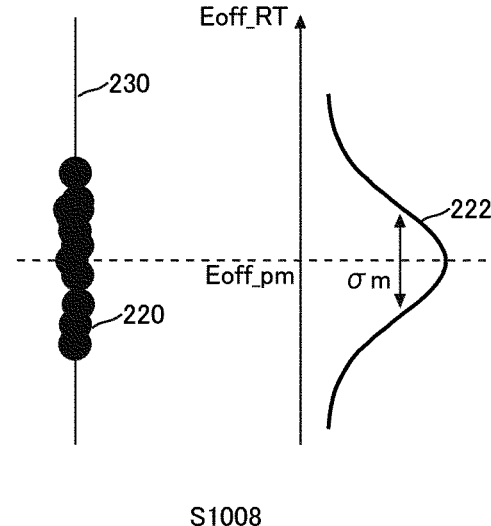
FIG. 9 illustrates an example of a measurement group distribution generating step S1008.

FIG. 9 illustrates an example of the measurement group distribution generating step S1008. In the measurement group distribution generating step S1008, for a plurality of measurement groups corresponding to a same set range 230, the group representative values 220 of the first characteristic and the second characteristic are acquired for each measurement group. For example, as shown in FIG. 7, the group representative value 220 belonging to the set range 230 including the combination of a carbon concentration C1 and an amount of helium irradiation He1 is extracted.

In the measurement group distribution generating step S1008, a measurement group distribution 222 showing a distribution of the group representative value 220 belonging to the same set range 230 is generated. The measurement group distribution 222 of the present example is a distribution in which a histogram of the group representative value 220 is approximated with a Gaussian distribution.

In the measurement group distribution generating step S1008, a distribution representative value of the measurement group distribution 222 is acquired. As an example, the distribution representative value is a value (Eoff_pm) of the first characteristic having the peak of the measurement group distribution 222, but is not limited thereto. Any distribution representative value may be used as long as it is a value that can define an on-axis position of the first characteristic of the measurement group distribution 222. The distribution representative value may be an average value of the measurement group distribution 222.

In addition, a shape information indicating a shape of the measurement group distribution 222 may be acquired in the measurement group distribution generating step S1008. The shape information is, for example, a standard deviation σm of the measurement group distribution 222, but is not limited thereto. Any shape information may be used as long as it is an information that can reproduce the shape of a distribution such as the statistical distribution as described above or a fitting parameter when fitting is performed by assuming a distribution that can characterize a distribution. In the measurement group distribution generating step S1008, the distribution representative value and the shape information are acquired for a plurality of the set ranges 230 in which the group representative value 220 exists.

Figure 10:
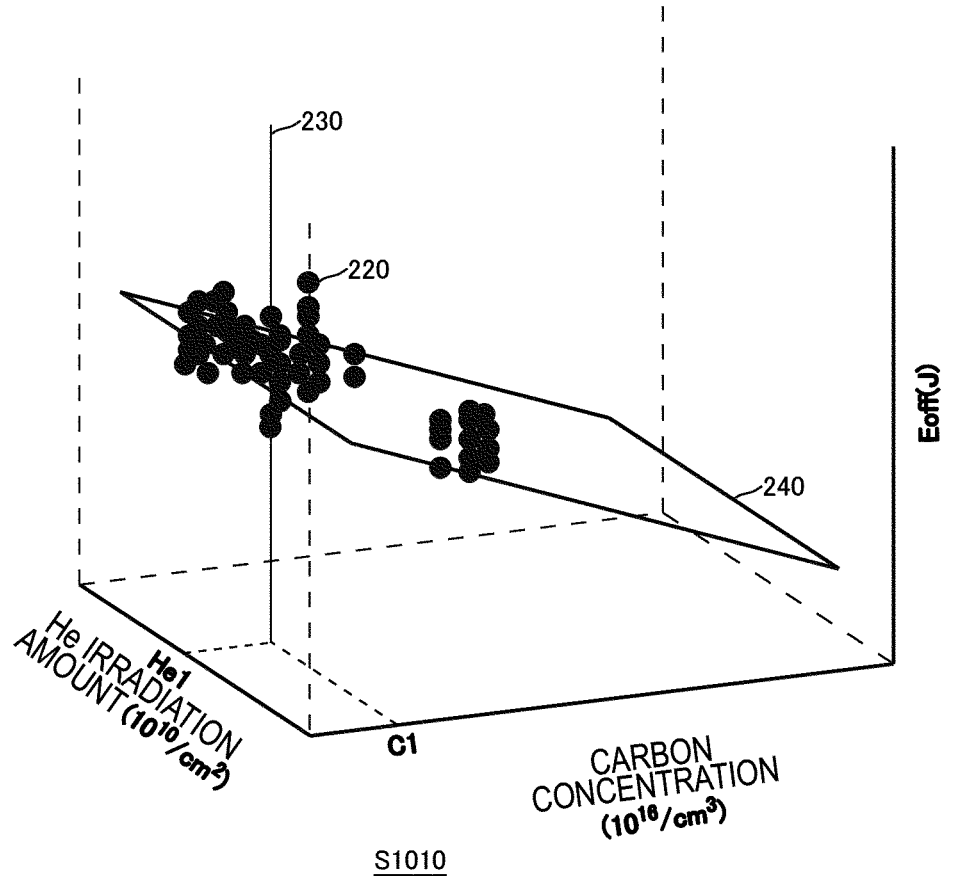
FIG. 10 illustrates a relationship information generating step S1010.

FIG. 10 illustrates the relationship information generating step S1010. The relationship information generating step S1010 generates a relationship information 240 indicating a relationship between values in a set range (for example, a median value of the carbon concentration and a median value of the amount of helium irradiation in the set range) and a distribution representative value (Eoff_pm). The relationship information 240 may be a regression plane in which fitting is performed to a plurality of sample points representing these relationships. These sample points are points in a three-dimensional space that are determined with a value of the carbon concentration, a value of the amount of helium irradiation, and a distribution representative value in a set range. The relationship information 240 indicates an approximate value of a distribution representative value in any set range.

In the relationship information generating step S1010, a relationship information indicating a relationship between values of a set range (the carbon concentration and the amount of helium irradiation, which are manufacture condition variables) and a shape information (σm) of the measurement group distribution 222 may be further generated. The relationship information indicates an approximate value of a shape information in any set range.

In the relationship information generating step S1010, a relationship information indicating a relationship between values of a set range (the carbon concentration and the amount of helium irradiation) and an information indicating a shape of the measurement distribution 208 (for example, each element of a variance-covariance matrix) may be further generated. The relationship information indicates an approximate value of a shape of the measurement distribution 208 in any set range.

As shown in FIG. 8, the processing step S1060 includes a set range determining step S1012, a group distribution acquiring step S1014, a virtual group generating step S1016, the virtual distribution generating step S1018, and the defect rate calculating step S1022. In the set range determining step S1012, a set range for which a defect rate should be calculated is selected.

Figure 11:
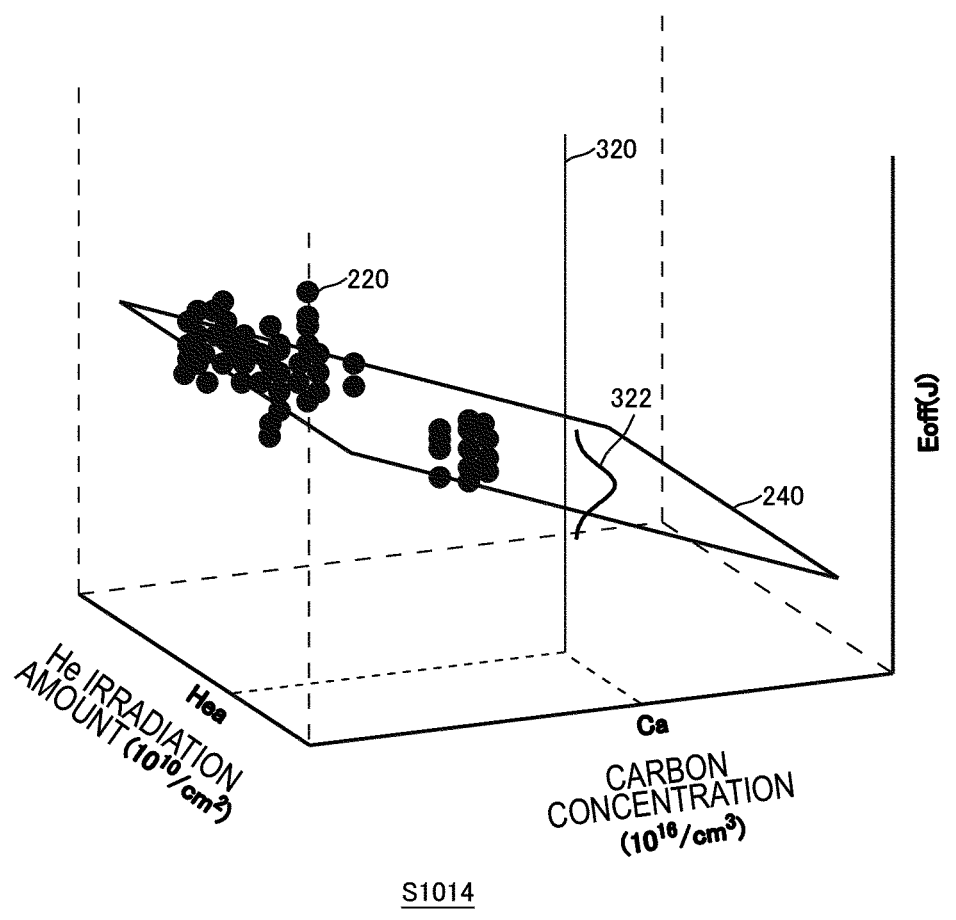
FIG. 11 illustrates a group distribution acquiring step S1014.

FIG. 11 illustrates the group distribution acquiring step S1014. In the group distribution acquiring step S1014, a virtual group distribution 322 in a selected set range 320 is acquired. The set range 320 may be a set range that is different from a set range in which the measurement group distribution 222 exists, or may be a same set range as the set range in which the measurement group distribution 222 exists. If the group representative value 220 of a measurement group exists in the set range 320, the measurement group distribution 222 may be used instead of the virtual group distribution 322 in the processing on the set range 320.

In the group distribution acquiring step S1014, an approximate value of a distribution representative value (Eoff_pm) in the set range 320 is acquired from the relationship information 240. Similarly, an approximate value of a shape information (σm) in the set range 320 is acquired. In the group distribution acquiring step S1014, the virtual group distribution 322 having a shape shown by the shape information (σm) is generated at a position on an axis of the first characteristic shown by the acquired distribution representative value. The virtual group distribution 322 may be a Gaussian distribution having a standard deviation σm. In the group distribution acquiring step S1014, the virtual group distribution 322 is generated for both the first characteristic and the second characteristic. The virtual group distribution 322 is a virtual distribution of group representative values that is assumed when a measurement group exists in each set range 320.

Figure 12:
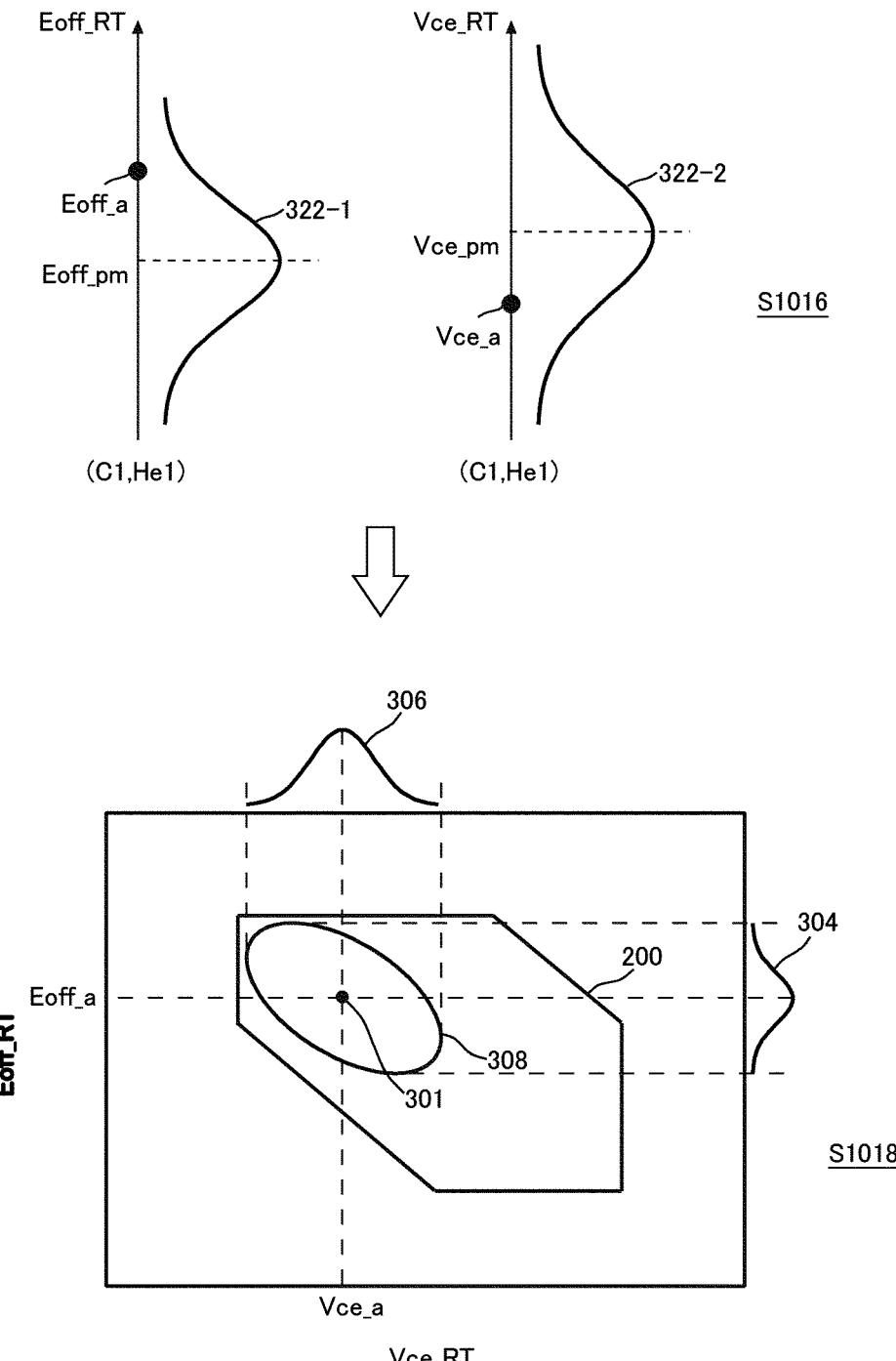
FIG. 12 illustrates a virtual group generating step S1016 and the virtual distribution generating step S1018.

FIG. 12 illustrates the virtual group generating step S1016 and the virtual distribution generating step S1018. In the virtual group generating step S1016, a plurality of virtual groups is generated based on the virtual group distribution 322 for each set range 320. In the virtual group generating step S1016, the plurality of virtual groups may be generated for both a set range in which the measurement group does not exist and a set range that is the same as the measurement group.

In the virtual group generating step S1016, according to an appearance probability of each value of the first characteristic and the second characteristic shown by a virtual group distribution 322-1 of the first characteristic and a virtual group distribution 322-2 of the second characteristic, group representative values (Eoff_a, Vce_a) of each virtual group are determined. That is, the distribution of the group representative values of the plurality of virtual groups generated in the virtual group generating step S1016 will be the same as the virtual group distribution 322.

In the virtual group generating step S1016, the group representative values of the first characteristic and the second characteristic may be independently determined based on each virtual group distribution 322. In another example, in the virtual group generating step S1016, a combination of group representative values of the first characteristic and the second characteristic may be determined further based on the shape information acquired in the shape information acquiring step S1006. For example, in the virtual group generating step S1016, the combination of the group representative values of the first characteristic and the second characteristic may be generated by using a variance-covariance matrix acquired in the shape information acquiring step S1006. In this manner, the group representative values of the virtual group can be determined in consideration of a correlation between the first characteristic and the second characteristic, and in consideration of an appearance probability in each virtual group distribution 322. The group representative values of each virtual group may be determined such that the shape of the group representative values of the plurality of virtual groups in a scatter diagram having the first characteristic and the second characteristic as its axes become similar with the shape of the measurement distribution 208.

In the virtual distribution generating step S1018, the virtual distribution 308 described in FIG. 5 is generated for each virtual group generated in the virtual group generating step S1016. That is, the virtual distribution 308 is applied by using a group representative value (Eoff_a, Vce_a) of a virtual group as a reference point 301. In the virtual distribution generating step S1018, the virtual distribution 308 including a predetermined number (for example, 5000) of samples may be generated by using the Monte Carlo simulation. The shape of the virtual distribution 308 can be determined based on an information (for example, a variance-covariance matrix) indicating a covariance of the first characteristic and the second characteristic in the measurement distribution 208. As described above, the information indicating the covariance of the first characteristic and the second characteristic may be determined for each set range. In this case, as described in FIG. 11, a relationship information indicating a relationship between each set range and the covariance may be generated. In addition, a common covariance information may be used for a plurality of set ranges. For example, a common covariance information may be generated from the measurement distribution 208 in one set range selected as a representative, or a common covariance information may be generated from an integrated distribution in which the measurement distributions 208 in a plurality of set ranges are integrated. Among the set ranges, a set range having a largest number of measurement groups may be selected as the representative described above.

In a determining step S1020, whether the processings of the virtual group generating step S1016 and the virtual distribution generating step S1018 are performed on a predetermined number of virtual groups is determined. If the number of processed virtual groups has not reached a predetermined number, a new virtual group is generated in the virtual group generating step S1016 and the virtual distribution 308 is generated in the virtual distribution generating step S1018.

If the number of processed virtual groups has reached a predetermined number (for example, 1000), in the defect rate calculating step S1022, the virtual distribution corresponding to each set range is used to calculate a defect rate in the set range. It should be noted that, in the defect rate calculating step S1022, a defect rate in the virtual distribution 308 may be calculated every time the virtual distribution 308 is generated in the virtual distribution generating step S1018. The defect rate calculating step S1022 may calculate an average value of the calculated defect rates as the defect rate in the set range. In another example, every time a new virtual distribution 308 is generated in the virtual distribution generating step S1018, an integrated distribution in which the virtual group is integrated with an already generated virtual distribution 308 may be generated. The defect rate calculating step S1022 may calculate a defect rate in the integrated distribution.

In a determining step S1024, whether a defect rate is calculated for all set ranges for which defect rates should be calculated is determined. If a set range for which a defect rate has not been calculated exists, a new set range is selected in the set range determining step S1012 and the processings of S1014 and the following will be performed. When defect rates are calculated for all the set ranges, the processings will be completed.

According to the present example, a virtual distribution can be generated also for a set range that is different from the set range in which the measurement group exists. Thus, a defect rate can be accurately estimated also for a set range in which the measurement group does not exist. In addition, a virtual group distribution is set and a virtual distribution is generated also for the same set range as the set range of the measurement group. In this manner, the number of samples can be increased and a defect rate can be accurately estimated also for the set range.

Although the example described in FIG. 1 to FIG. 12 used the first characteristic and the second characteristic to analyze the defect rate, a third characteristic may be further used to analyze the defect rate. The third characteristic is, for example, a leakage current Ices. In this case, a covariance of the first characteristic, the second characteristic, and the third characteristic is used instead of the covariance of the first characteristic and the second characteristic shown by Numerical expression 1. In addition, although the two-dimensional virtual distribution 308 is used in FIG. 5 to FIG. 12, when analyzing three characteristics, a three-dimensional virtual distribution 308 having respective axes of the first characteristic, the second characteristic, and the third characteristic is used. Other processings are the same as the example described in FIG. 1 to FIG. 12. Furthermore, four or more characteristics may be used to analyze the defect rate.

FIG. 13 shows an example of a defect rate generated in the defect rate calculating step S1022. The defect rate calculating step S1022 calculates a defect rate Xij for each set range determined by a combination of a carbon concentration and an amount of helium irradiation, which are manufacture condition variables. i represents a range of the carbon concentration, and j represents a range of the amount of helium irradiation. The defect rate calculating step S1022 may generate a table having a matrix shape shown in FIG. 13. Each box in FIG. 13 corresponds to a set range. It should be noted that, although FIG. 13 shows a defect rate by the first characteristic (Eoff), in the defect rate calculating step S1022, defect rates for each of the first characteristic and the second characteristic are calculated for each set range.

FIG. 14 shows an example of a defect rate generated in the defect rate calculating step S1022. FIG. 14 shows a defect rate Yij for the second characteristic in each set range.

FIG. 15 shows an example of a defect rate generated in the defect rate calculating step S1022. In the defect rate calculating step S1022 of the present example, a table of integrated defect rates in which a table of defect rates of the first characteristic and a table of defect rates of the second characteristic are integrated is generated. An integrated defect rate Zij for each set range is calculated also in the present example. In the present example, a higher one of the defect rate Xij of the first characteristic and the defect rate Yij of the second characteristic in each set range (that is, the one having a higher probability of being determined as a defect) may be regarded as the integrated defect rate Zij of each set range.

FIG. 16 shows a probability of occurrence Rij of each set range. The probability of occurrence Rij of the set range represents a probability of a carbon concentration in the semiconductor substrate 10 used for the manufacture of the semiconductor device 100 and an irradiation amount of helium ions in the manufacturing process of the semiconductor device 100 as manufacture condition variables becoming each set range. It should be noted that the irradiation amount of helium ions in the manufacturing process has a small error with respect to a set value. Thus, the probability of occurrence of the set range not including the set value of the irradiation amount of helium ions may be set to 0. A probability distribution of the carbon concentration of the semiconductor substrate 10 may be supplied from a manufacturer of the semiconductor substrate 10 or may be generated from measurement values in the past.

In the defect rate calculating step S1022, a value in which a defect rate (for example, Zij) is multiplied by the probability of occurrence Rij may be calculated in each set range. In addition, in the defect rate calculating step S1022, an average defect rate of the semiconductor device 100 when manufacturing the semiconductor device 100 using the semiconductor substrate 10 and with the irradiation amount of helium ions may be calculated by integrating the value obtained by multiplying the defect rate by the probability of occurrence.

Figure 17:
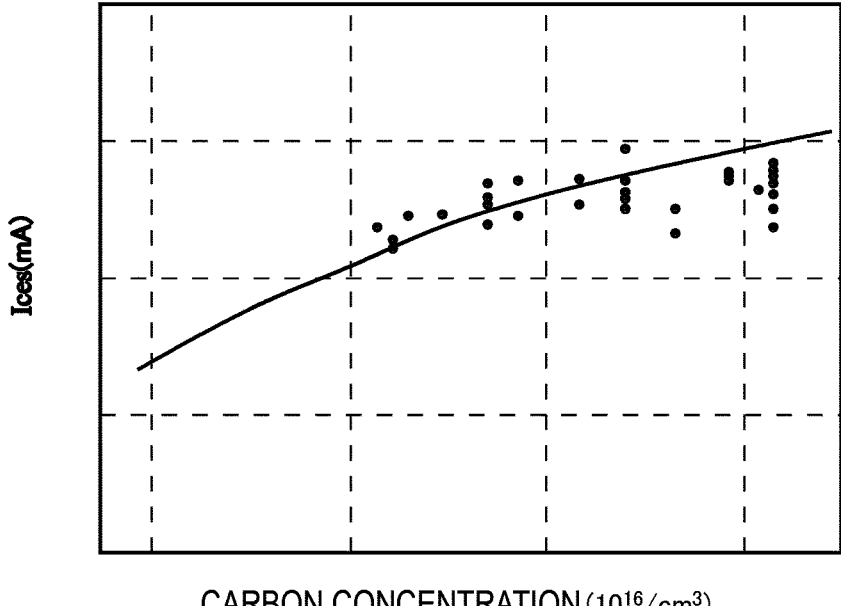
FIG. 17 illustrates another embodiment of the analysis method.

FIG. 17 illustrates another embodiment of the analysis method. In the embodiment described in FIG. 2 to FIG. 16, the first characteristic and the second characteristic (for example, the turn-off loss Eoff and the saturated voltage Vce at the time of an on-state) are used as the characteristics of the semiconductor device 100. In the present example, one characteristic is used as the characteristic of the semiconductor device 100. The characteristic used in the present example may be either of the turn-off loss Eoff or the saturated voltage Vce at the time of an on-state, or may be another characteristic. In the present example, the characteristic of the leakage current Ices of the semiconductor device 100 is used to analyze the defect rate of the semiconductor device 100. It should be noted that, also in the example described in FIG. 1 to FIG. 16, either of the first characteristic and the second characteristic may be replaced with the leakage current Ices.

The leakage current Ices is a current that flows between the collector electrode 24 and the emitter electrode 52 when a predetermined voltage is applied to the collector electrode 24 and the emitter electrode 52 in a state where a gate electrode (for example, the gate conductive portion 44) and the emitter electrode 52 are electrically short-circuited (that is, in a state where the transistor portion 70 is turned off). The predetermined voltage may be a specification value determined in accordance with characteristics that should be possessed by the semiconductor device 100, or may be a rated voltage of the semiconductor device 100, or may be another voltage.

FIG. 17 shows an example of a relationship between the carbon concentrations of the semiconductor substrate 10 and the leakage current Ices. Plots of circle marks in FIG. 17 show measurement values, and the solid curved line shows an approximate curve. As shown in FIG. 17, the leakage current Ices varies in accordance with the carbon concentrations. In addition, the leakage current Ices also varies in accordance with the irradiation amount of a charged particle beam (for example, helium) against the semiconductor substrate 10. Thus, a defect rate of the leakage current Ices with respect to the carbon concentration and the irradiation amount of the charged particle beam can be accurately analyzed by analyzing a variation of the leakage current Ices in accordance with the two variables, which are the carbon concentration and the irradiation amount of the charged particle beam. In addition, it is possible to accurately analyze how to set the carbon concentration and the irradiation amount of the charged particle beam to make the defect rate of the leakage current Ices to fall within a tolerable range.

The processing procedures of the analysis method when analyzing the defect rate of the semiconductor device 100 based on one characteristic are also the same as the flowchart shown in FIG. 8. In the present example, the analysis method is described based on the flowchart shown in FIG.

8. Unless particularly described otherwise, the processing content in each step of the flowchart may be the same as any of the examples described in FIG. 1 to FIG. 16. In addition, the content of each step described in FIG. 17 and the following drawings may be at least partially applied also in each step of the embodiment described in FIG. 1 to FIG. 16.

Figure 18A:
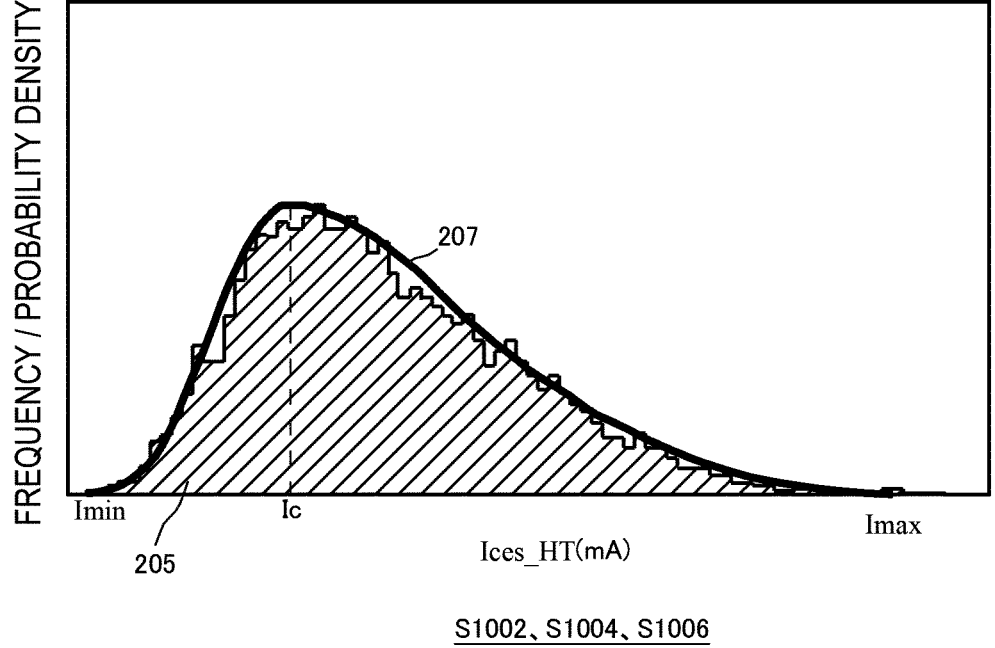
FIG. 18A illustrates an example of the measurement value acquiring step S1002, the measurement distribution generating step S1004, and the shape information acquiring step S1006.

FIG. 18A illustrates an example of the measurement value acquiring step S1002, the measurement distribution generating step S1004, and the shape information acquiring step S1006. In the measurement value acquiring step S1002, a measurement value of one characteristic (in the present example, the leakage current Ices) of a plurality of the semiconductor devices 100 is acquired. The measurement value may be a measurement value at the room temperature (RT), or may be a measurement value at a high temperature environment (HT) higher than the room temperature, or may be a measurement value at a low temperature environment (LT) lower than the room temperature. In the present example, a measurement value of the leakage current Ices at the high temperature environment (for example, 175° C.) is shown.

In the measurement value acquiring step S1002, measurement values of the characteristic of the plurality of semiconductor devices in which at least either of the carbon concentration in the semiconductor substrate 10 per unit volume and the irradiation amount of helium ions against the semiconductor substrate 10 per unit area is included in a predetermined set range, are acquired. In the measurement value acquiring step S1002, measurement values of the semiconductor devices in which the carbon concentration and the irradiation amount of helium ions are both included in each set range may be acquired. That is, in the measurement value acquiring step S1002, measurement values of the plurality of semiconductor devices 100 in which the carbon concentration and the amount of helium irradiation as the manufacture condition variables are equivalent may be acquired. In the measurement value acquiring step S1002, characteristics of the plurality of the semiconductor devices 100 included in one or a plurality of lots in which manufacture condition variables are equivalent, may be measured.

In the measurement distribution generating step S1004, a measurement distribution 205 showing a distribution, in one measurement group, of measurement values of a characteristic (in the present example, the leakage current Ices) is generated. The measurement values of the leakage current Ices of the present example distribute from a minimum value Imin to a maximum value Imax. The measurement distribution 205 may be a histogram having the leakage current Ices as its horizontal axis and the number of samples (frequency) as its vertical axis. The vertical axis of the histogram may represent a probability density for occurrence of each value of the leakage current Ices. The probability density is a value obtained by dividing a frequency of each value of the leakage current Ices by a total frequency. In the measurement distribution generating step S1004, a distribution 207 in which a histogram is approximated may be generated as shown in FIG. 18A. The distribution 207 may be a curved line in which a histogram is approximated with a symmetric or asymmetric normal distribution, or may be another approximated curved line. A value of the characteristic representing a peak in the distribution 207 is denoted by Ic.

In the shape information acquiring step S1006, a shape information indicating a shape of the measurement distribution 205 is acquired. In the shape information acquiring step S1006, a probability of occurrence of each value of the leakage current Ices in the measurement distribution 205 may be acquired. In the shape information acquiring step S1006, a shape information of the distribution 207 in which the measurement distribution 205 is approximated may be acquired. The distribution 207 corresponds to a probability density function of each value of the leakage current Ices. In the shape information acquiring step S1006, a probability density function representing the distribution 207 may be acquired, and at least one information among an average value, a variance, a skewness, a peakedness, and a standard deviation of the distribution 207 may be acquired. The shape information is not limited to these kinds of information. Any shape information may be used as long as it is an information that can reproduce the shape of the distribution 207.

Figure 18B:
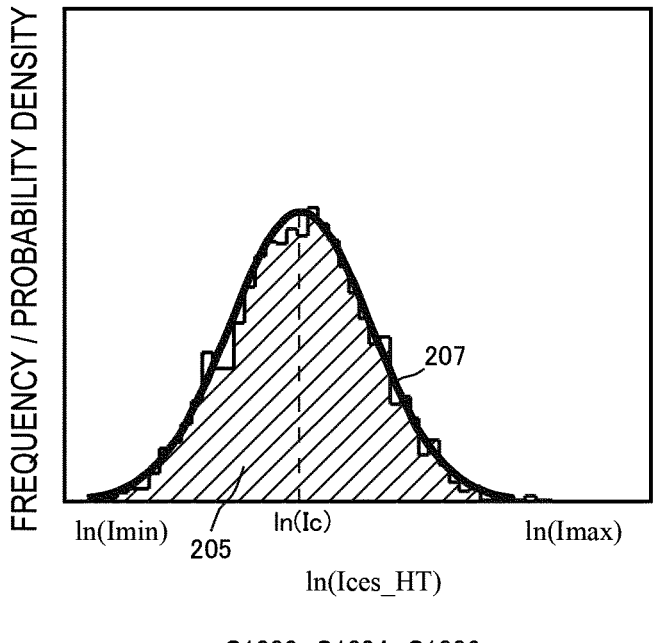
FIG. 18B illustrates another example of the measurement value acquiring step S1002, the measurement distribution generating step S1004, and the shape information acquiring step S1006.

FIG. 18B illustrates another example of the measurement value acquiring step S1002, the measurement distribution generating step S1004, and the shape information acquiring step S1006. As shown in FIG. 18A, the histogram of the leakage current Ices may have a shape in which a peak is biased to the low current side. In each step shown in FIG. 8, a measurement value of a characteristic such as the leakage current Ices may be used as it is, or a converted measurement value in which the measurement value has been converted with a predetermined arithmetic expression may also be used.

In the measurement distribution generating step S1004, the measurement value of the leakage current Ices may be converted with the predetermined arithmetic expression, and the measurement distribution 205 of the converted measurement value may be generated. The arithmetic expression may be an expression in which the measurement distribution 205 of the converted measurement value gets close to a normal distribution. The measurement distribution generating step S1004 of the present example uses a logarithmic normal distribution in which a measurement value x of the leakage current Ices has been converted into a measurement value ln(x). ln is a natural logarithm. In the measurement distribution generating step S1004, the distribution 207 in which the measurement distribution 205 of the converted measurement value is approximated may be generated. The distribution 207 may be a curved line in which the measurement distribution 205 is approximated with a normal distribution.

In the shape information acquiring step S1006, a shape information indicating a shape of the measurement distribution 205 is acquired. In the shape information acquiring step S1006, a probability of occurrence of each value of the leakage current Ices in the measurement distribution 205 may be acquired. In the shape information acquiring step S1006, a shape information of the distribution 207 in which the measurement distribution 205 is approximated may be acquired. In the shape information acquiring step S1006 of the present example, a probability density function f(x) representing the distribution 207 is acquired. The probability density function f(x) is a logarithmic normal distribution expressed by the following expression.

$$f(x) = \frac{1}{\sqrt{2\pi\sigma^2}x}\exp\left(-\frac{(\ln x - \mu)^2}{2\sigma^2}\right) \qquad \text{[Numerical expression 2]}$$

It should be noted that x is a measurement value (mA) of the leakage current Ices, and ln is a natural logarithm. σ corresponds to a standard deviation of the measurement distribution 205, and μ corresponds to an average value. σ and μ in Numerical expression 2 are determined such that an error between the probability density function f(x) and the measurement distribution 205 is minimized. In this manner, the probability density function f(x) representing the distribution 207 can be acquired. In addition, by using the converted measurement value, the measurement distribution 205 is readily approximated with a normal distribution, and the probability density function f(x) can be accurately calculated.

Figure 19:
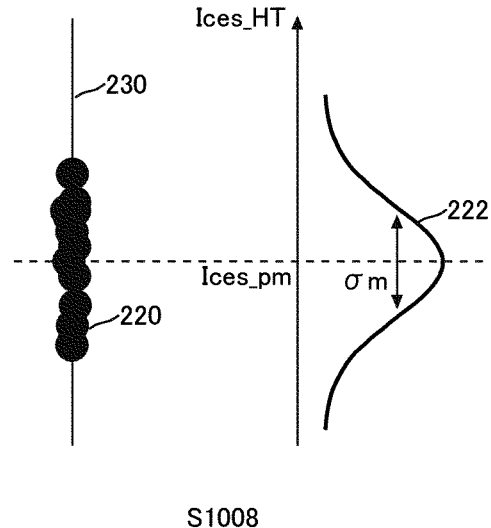
FIG. 19 illustrates an example of the measurement group distribution generating step S1008.

FIG. 19 illustrates an example of the measurement group distribution generating step S1008. The measurement group distribution generating step S1008 of the present example performs the same processing as the measurement group distribution generating step S1008 described in FIG. 9 except for the point that the targeted characteristic is the leakage current Ices.

Although a value (Ices_pm) of the characteristic having the peak of the measurement group distribution 222 is acquired as a distribution representative value of the measurement group distribution 222 in the measurement group distribution generating step S1008 of the present example, the distribution representative value is not limited thereto. The distribution representative value may be any value as long as it can define the on-axis position of the characteristic value of the measurement group distribution 222. In addition, in the measurement group distribution generating step S1008, a shape information indicating a shape of the measurement group distribution 222 may be acquired. The shape information may be the standard deviation σm as in the case of the example in FIG. 9, or may be another information. The measurement value after conversion may be used as in the case of the example in FIG. 18B, also in the measurement group distribution generating step S1008. The same also applies to other steps.

Figure 20:
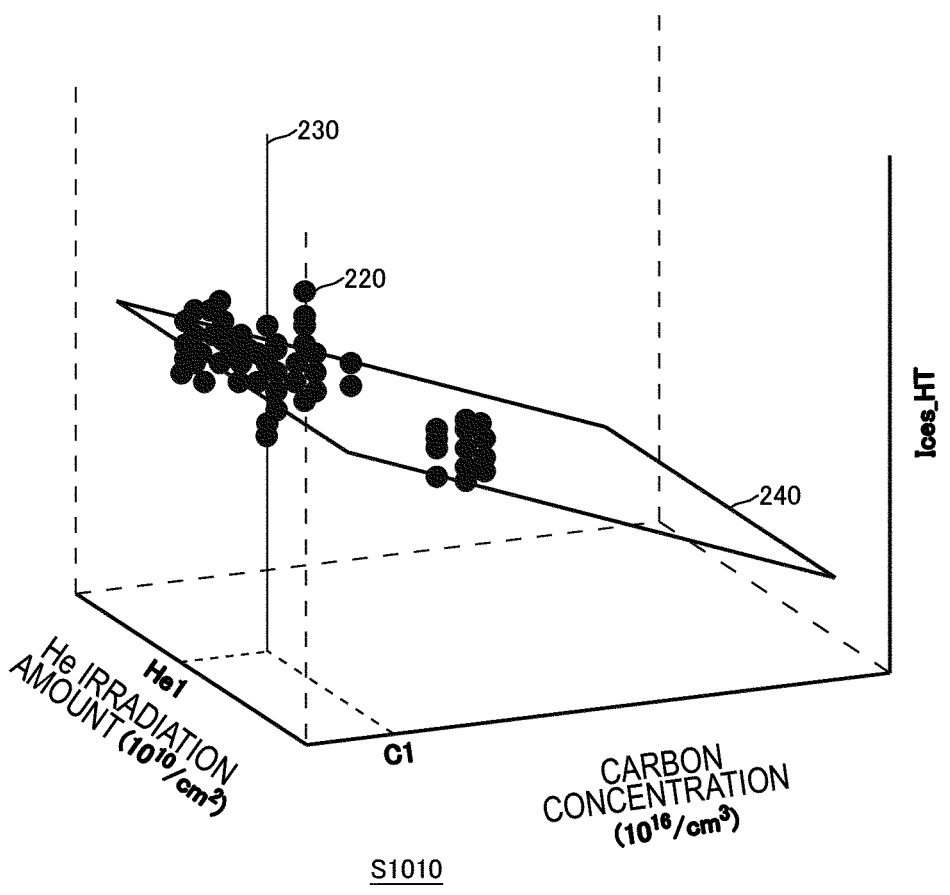
FIG. 20 illustrates the relationship information generating step S1010.

FIG. 20 illustrates the relationship information generating step S1010. The relationship information generating step S1010 of the present example performs the same processing as the measurement group distribution generating step S1008 described in FIG. 10 except for the point that the targeted characteristic is the leakage current Ices. In the relationship information generating step S1010, a relationship information 240 indicating a relationship between values (the carbon concentration and the amount of helium irradiation) in a set range and a distribution representative value (for example, Ices_pm) is acquired.

Figure 21:
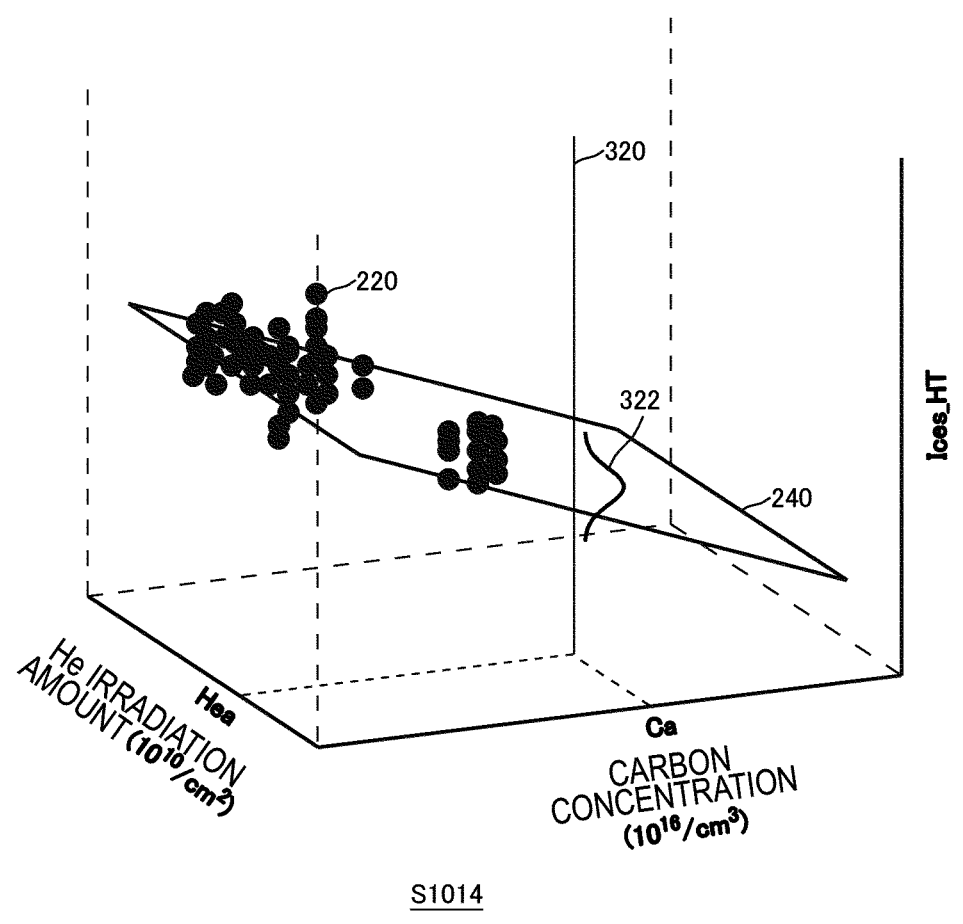
FIG. 21 illustrates the group distribution acquiring step S1014.

FIG. 21 illustrates the group distribution acquiring step S1014. The group distribution acquiring step S1014 of the present example performs the same processing as the group distribution acquiring step S1014 described in FIG. 11 except for the point that the targeted characteristic is the leakage current Ices. In the group distribution acquiring step S1014, a virtual group distribution 322 in a selected set range 320 is acquired.

Figure 22:
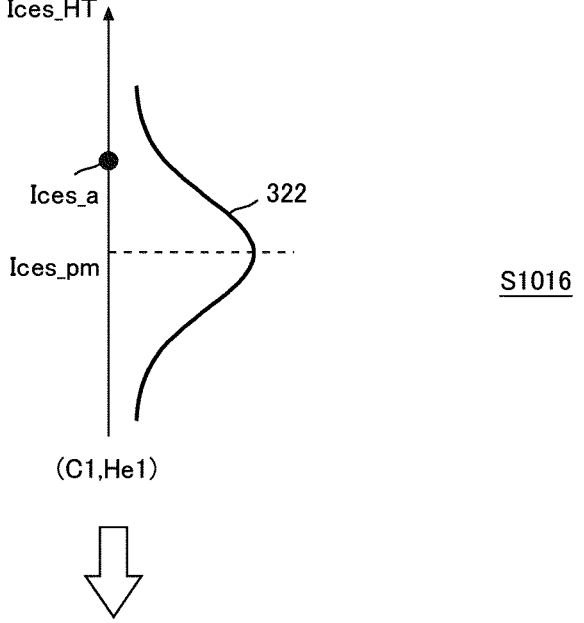
FIG. 22 illustrates the virtual group generating step S1016, the virtual distribution generating step S1018, a determining step S1020, and the defect rate calculating step S1022.
Figure 22:
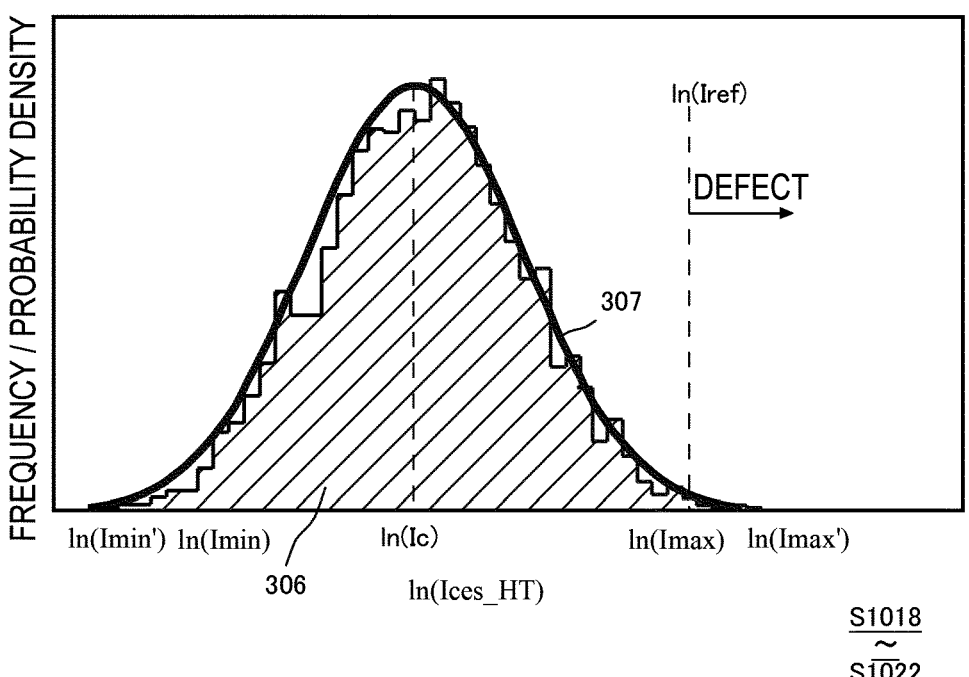

FIG. 22 illustrates the virtual group generating step S1016, the virtual distribution generating step S1018, the determining step S1020, and the defect rate calculating step S1022. In the virtual group generating step S1016, a plurality of virtual groups is generated based on the virtual group distribution 322 for each set range 320. In the virtual group generating step S1016, the plurality of virtual groups may be generated for both a set range in which the measurement group does not exist and a set range that is the same as the measurement group.

In the virtual group generating step S1016, a group representative value (Ices_a) of each virtual group is determined in accordance with an appearance probability of a measurement value of the characteristic shown in the virtual group distribution 322. That is, the distribution of the group representative values of the plurality of virtual groups generated in the virtual group generating step S1016 will be the same as the virtual group distribution 322.

In the virtual distribution generating step S1018, the virtual distribution described in FIG. 5 is generated for each of the virtual groups generated in the virtual group generating step S1016. It should be noted that, since one characteristic is targeted in the present example, the distribution 306 (or the distribution 304) shown in FIG. 5 is generated as the virtual distribution. In the virtual distribution generating step S1018, the distribution 306 that is virtual is applied by using the group representative value (Ices_a) of the virtual group as a reference point in the axis of the characteristic. In the virtual distribution generating step S1018, the distribution 306 including a predetermined number (for example, 5000) of samples may be generated by using the Monte Carlo simulation. In the virtual distribution generating step S1018, the distribution 306 can be generated by randomly generating a virtual measurement value of each leakage current Ices in accordance with a probability of occurrence (for example, the probability density function f(x)) of each measurement value in the measurement distribution 205 or the distribution 207. The shape of the distribution 306 is the same shape as the measurement distribution 205 or the distribution 207.

As described above, the shape information (that is, the probability of occurrence of each measurement value) of the characteristic distribution may be determined per set range. In addition, a common shape information may be used for a plurality of set ranges. For example, the common shape information may be generated from the distribution 207 in one set range selected as the representative, or the common shape information may be generated from an integrated distribution in which the distributions 207 in a plurality of set ranges are integrated. Among the set ranges, a set range having a largest number of measurement groups may be selected as the representative described above.

In the determining step S1020, whether the processings of the virtual group generating step S1016 and the virtual distribution generating step S1018 are performed on a predetermined number of virtual groups is determined. If the number of processed virtual groups has not reached the predetermined number, a new virtual group is generated in the virtual group generating step S1016, and a virtual distribution 306 is generated in the virtual distribution generating step S1018. In the virtual distribution generating step S1018, the distributions 306 generated per virtual group are integrated to generate one distribution 306. In this manner, the virtual distribution 306 in which samples are distributed in a range that is wider than the measurement distribution 205 can be acquired. In the example of FIG. 22, a minimum value (ln(Imin')) of the leakage current Ices in the distribution 306 is smaller than a minimum value (ln(Imin')) of the measurement distribution 205, and a maximum value (ln(Imax')) of the leakage current Ices in the distribution 306 is larger than a maximum value (ln(Imax')) of the measurement distribution 205.

If the number of processed virtual groups has reached a predetermined number (for example, 1000), in the defect rate calculating step S1022, the virtual distribution corresponding to each set range is used to calculate a defect rate in the set range. In the defect rate calculating step S1022, a percentage of the leakage current Ices becoming larger than a predetermined reference value Iref in the virtual distribution 306 of the leakage current Ices may be calculated as the defect rate. The reference value of the present example is ln(Iref). The defect rate calculating step S1022 may calculate the approximate distribution 307 in which the distribution 306 is approximated. The approximate distribution 307 may be a normal distribution in which fitting is performed such that an error from the distribution 306 becomes minimum, or may be a distribution having another shape. The defect rate calculating step S1022 may calculate a percentage of the leakage current Ices becoming larger than a predetermine reference value Iref in the approximate distribution 307 as the defect rate.

In the determining step S1024 shown in FIG. 8, whether a defect rate is calculated for all set ranges for which defect rates should be calculated is determined. If a set range for which a defect rate has not been calculated exists, a new set range is selected in the set range determining step S1012 and the processings of S1014 and the following are performed. When defect rates are calculated for all the set ranges, the processings will be completed.

According to the present example, a virtual distribution can be generated also for a set range that is different from the set range in which the measurement group exists. Thus, a defect rate can be accurately estimated also for a set range in which the measurement group does not exist. In addition, a virtual group distribution is set and a virtual distribution is generated also for the same set range as the set range of the measurement group. In this manner, the number of samples can be increased and a defect rate can be accurately estimated also for the set range.

FIG. 23 shows an example of the defect rate generated in the defect rate calculating step S1022. The defect rate calculating step S1022 calculates a defect rate Wij for each set range determined by a combination of a carbon concentration and an amount of helium irradiation, which are manufacture condition variables. i represents a range of the carbon concentration, and j represents a range of the amount of helium irradiation. The defect rate calculating step S1022 may generate a table having a matrix shape shown in FIG. 23. Each box in FIG. 23 corresponds to a set range. The defect rate calculating step S1022 may generate a table of defect rates shown in FIG. 23 for a plurality of characteristics (for example, at least two of Eoff, Vce, Ices). In the defect rate calculating step S1022, a plurality of tables may be integrated to calculate the defect rate of each set range as described in FIG. 14.

Figure 24:
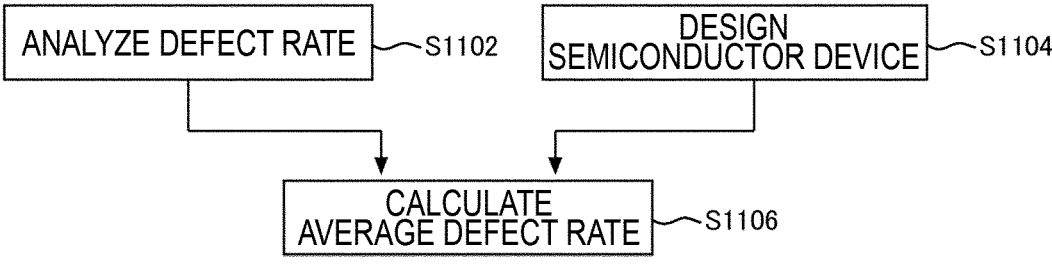
FIG. 24 shows another example of the analysis method.

FIG. 24 shows another example of the analysis method. The analysis method includes a defect rate analyzing step S1102, a semiconductor device designing step S1104, and an average defect rate calculating step S1106. The processing in the defect rate analyzing step S1102 is the same as the analysis method described in FIG. 1 to FIG. 23. That is, a defect rate in each set range is calculated in the defect rate analyzing step S1102.

In the semiconductor device designing step S1104, the irradiation amount of helium ions is determined based on the carbon concentration in the semiconductor substrate 10 used for the manufacture of the semiconductor device 100 and the characteristic that should be possessed by the semiconductor device 100. For example, in the semiconductor device designing step S1104, the irradiation amount of helium ions is determined in accordance with the value of a carrier lifetime that should be possessed by the semiconductor device 100. The carbon concentration of the semiconductor substrate 10 may be an information supplied from a manufacturer of the semiconductor substrate 10 or may be acquired by measuring the semiconductor substrate 10.

In the average defect rate calculating step S1106, an average defect rate of the semiconductor device 100 is calculated based on the irradiation amount of helium ions determined in the semiconductor device designing step S1104. For example, in the average defect rate calculating step S1106, as described in FIG. 16, the average defect rate may be calculated by setting the probability of occurrence of the set range not including the determined irradiation amount of helium ions to 0. With such processing, if the irradiation amount of helium ions is changed, a defect rate of the semiconductor device 100 after the change can be estimated.

In addition, the analysis method may include a semiconductor device designing step for determining a tolerable range of the irradiation amount of helium ions based on the carbon concentration in the semiconductor substrate 10 used for the manufacture of the semiconductor device 100 and the defect rate in each set range. In this case, a value allowed to be the average defect rate of the semiconductor device 100 may be set. In the semiconductor device designing step, when setting the irradiation amount of helium ions to a certain value, a tolerable range for the set value of the irradiation amount of helium ions may be presented such that the average defect rate described in FIG. 24 becomes a tolerance or smaller.

Figure 25:
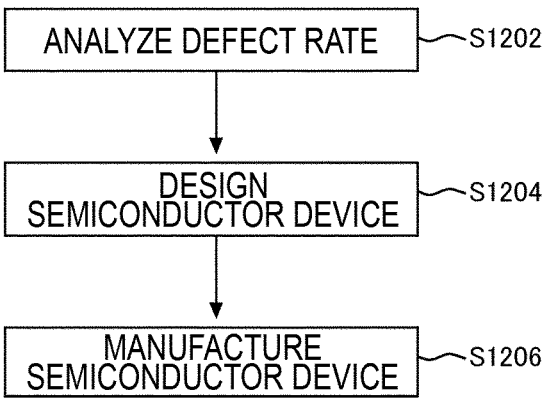
FIG. 25 shows an example of a manufacturing method of the semiconductor device 100.

FIG. 25 shows an example of a manufacturing method of the semiconductor device 100. The manufacturing method includes a defect rate analyzing step S1202, a semiconductor device designing step S1204, and a semiconductor device manufacturing step S1206. The defect rate analyzing step S1202 is the same as the analysis method described in FIG. 1 to FIG. 24.

The semiconductor device designing step S1204 determines the irradiation amount of helium ions against the semiconductor substrate 10 used for the manufacture of the semiconductor device 100 based on the defect rate in each set range. The semiconductor device designing step S1204 may be the same as the semiconductor device designing step described in FIG. 24.

In the semiconductor device manufacturing step S1206, the semiconductor substrate 10 is irradiated with helium ions of the irradiation amount determined in the semiconductor device designing step S1204. In addition, in the semiconductor device manufacturing step S1206, each member of the semiconductor device 100 described in FIG. 1 is formed. With such method, the semiconductor device 100 can be designed and manufactured while accurately estimating the defect rate.

Figure 26:
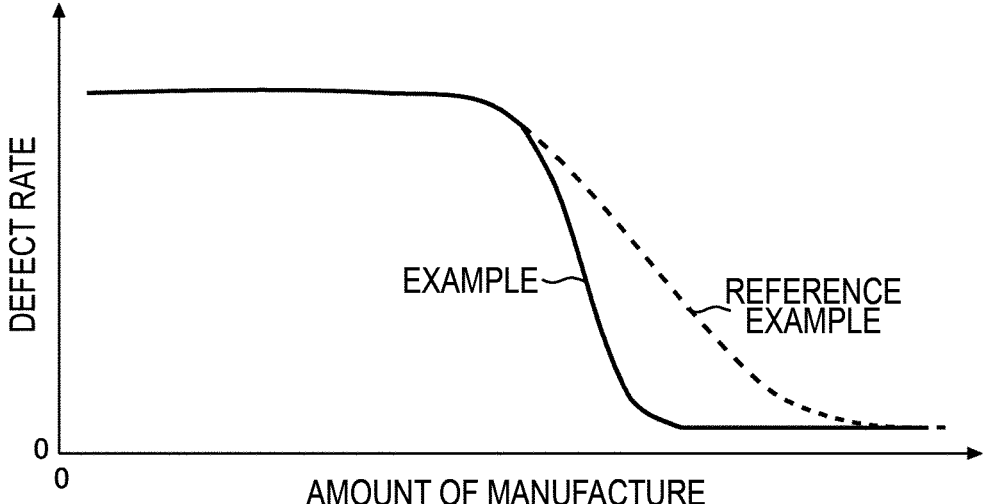
FIG. 26 shows a relationship between an amount of manufacture of the semiconductor device 100 and a transition of the defect rate.

FIG. 26 shows a relationship between an amount of manufacture of the semiconductor device 100 and a transition of defect rates. In a reference example, if a defect occurs in the manufactured semiconductor device 100, the information is fed back to the manufacturing process to suppress occurrence of the defect. In this case, if the amount of manufacture of the semiconductor device 100 becomes a certain level or more, the accuracy of feedback improves, and the defect rate will be gradually decreased.

Meanwhile, by using the analysis method according to an embodiment, many characteristics of the virtual semiconductor device 100 are generated and the defect rate can be analyzed. Thus, it becomes easier to appropriately set a parameter such as the irradiation amount of helium ions, and suppression of occurrence of the defect can be accelerated.

Figure 27:
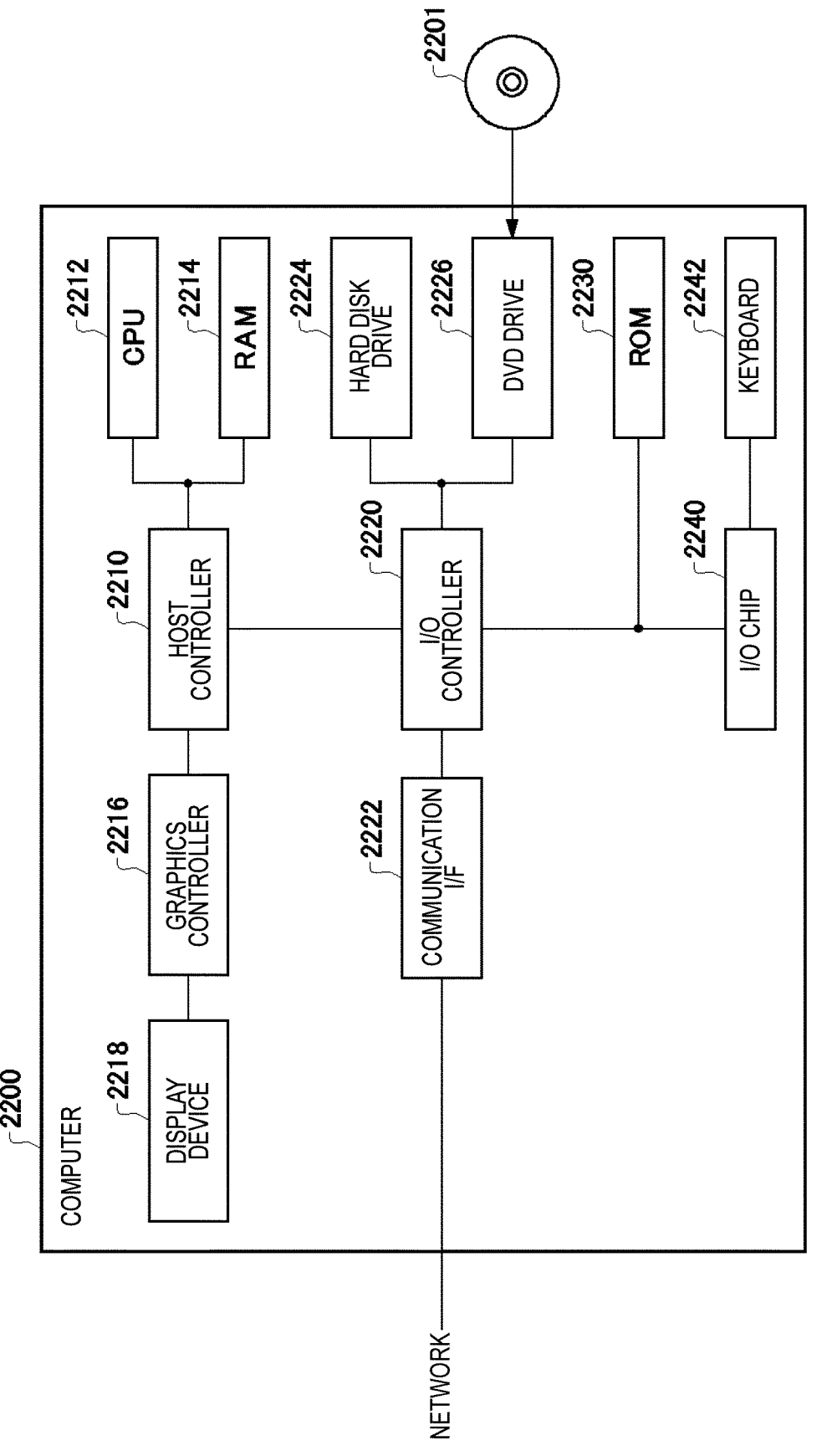
FIG. 27 shows an example of a computer 2200 in which a plurality of aspects of the analysis method may be entirely or partially embodied.

FIG. 27 shows an example of a computer 2200 in which a plurality of aspects of the analysis method may be entirely or partially embodied. The computer 2200 is installed with a program causing the computer 2200 to perform the analysis method described in FIG. 1 to FIG. 26.

The program installed in the computer 2200 can cause the computer 2200 to function as operations associated with a device according to an embodiment of the present invention or as one or more sections of the device, or can cause the performance of the operations or one or more sections, and/or can cause the computer 2200 to perform a method according to an embodiment of the present invention or a step of the method. Such programs may be executed by a CPU 2212 to cause the computer 2200 to perform specific operations associated with some or all of the blocks in the flowcharts and block diagrams described in the present specification.

The computer 2200 according to the present embodiment includes the CPU 2212, an RAM 2214, a graphic controller 2216, and a display device 2218, which are interconnected by a host controller 2210. The computer 2200 also includes input/output units such as a communication interface 2222, a hard disk drive 2224, a DVD-ROM drive 2226, and an IC card drive, which are connected to the host controller 2210 via an input/output controller 2220. The computer also includes legacy input/output units such as an ROM 2230 and a keyboard 2242, which are connected to the input/output controller 2220 via an input/output chip 2240.

The CPU 2212 operates according to programs stored in the ROM 2230 and the RAM 2214, thereby controlling each unit. The graphic controller 2216 acquires image data generated by the CPU 2212 in a frame buffer or the like provided in the RAM 2214 or in itself, such that the image data is displayed on the display device 2218.

The communication interface 2222 communicates with other electronic devices via a network. The hard disk drive 2224 stores programs and data used by the CPU 2212 within the computer 2200. The DVD-ROM drive 2226 reads a program or data from a DVD-ROM 2201 and provides the program or data to the hard disk drive 2224 via the RAM 2214. The IC card drive reads programs and data from an IC card, and/or writes programs and data to the IC card.

The ROM 2230 stores therein boot programs and the like executed by the computer 2200 at the time of activation, and/or programs that depend on the hardware of the computer 2200. The input/output chip 2240 may also connect various input/output units to the input/output controller 2220 via a parallel port, a serial port, a keyboard port, a mouse port, or the like.

A program is provided by computer readable media such as the DVD-ROM 2201 or the IC card. The program is read from the computer readable media, installed into the hard disk drive 2224, the RAM 2214, or the ROM 2230, which are also examples of computer readable media, and executed by the CPU 2212. Information processing written in these programs is read by the computer 2200, and provides cooperation between the programs and the various types of hardware resources described above. The device or method may be configured by implementing operations or processings of information according to use of the computer 2200.

For example, in a case where communication is performed between the computer 2200 and an external device, the CPU 2212 may execute a communication program loaded in the RAM 2214 and instruct the communication interface 2222 to perform communication processing based on a processing written in the communication program. Under the control of the CPU 2212, the communication interface 2222 reads transmission data stored in a transmission buffer processing region provided in a recording medium such as the RAM 2214, the hard disk drive 2224, the DVD-ROM 2201, or the IC card, transmits the read transmission data to the network, or writes reception data received from the network in a reception buffer processing region or the like provided on the recording medium.

In addition, the CPU 2212 may cause the RAM 2214 to read all or a necessary part of a file or database stored in an external recording medium such as the hard disk drive 2224, the DVD-ROM drive 2226 (DVD-ROM 2201), the IC card, or the like, and may execute various types of processing on data on the RAM 2214. Then, the CPU 2212 writes the processed data back in the external recording medium.

Various types of information such as various types of programs, data, tables, and databases may be stored in a recording medium and subjected to information processing. The CPU 2212 may execute, on the data read from the RAM 2214, various types of processing including various types of operations, information processing, conditional judgement, conditional branching, unconditional branching, information retrieval/replacement, or the like described throughout the present disclosure and specified by instruction sequences of the programs, and writes the results back to the RAM 2214. In addition, the CPU 2212 may retrieve information in a file, a database, or the like in the recording medium. For example, when a plurality of entries, each having an attribute value of a first attribute associated with an attribute value of a second attribute, is stored in the recording medium, the CPU 2212 may retrieve, out of the plurality of entries, an entry with the attribute value of the first attribute specified that meets a condition, read the attribute value of the second attribute stored in said entry, and thereby acquiring the attribute value of the second attribute associated with the first attribute meeting a predetermined condition.

The programs or software modules described above may be stored in a computer readable medium on or near the computer 2200. In addition, a recording medium such as a hard disk or an RAM provided in a server system connected to a dedicated communication network or the Internet can be used as a computer readable medium, thereby providing a program to the computer 2200 via the network.

While the embodiments of the present invention have been described, the technical scope of the present invention is not limited to the scope described in the embodiments described above. It is apparent to persons skilled in the art that various alterations or improvements can be added to the embodiments described above. It is also apparent from the descriptions of the scope of the claims that the embodiments added with such alterations or improvements can also be included in the technical scope of the present invention.

It should be noted that each processing such as operations, procedures, steps, and stages in a device, a system, a program, and a method shown in the claims, the specification, and the drawings may be performed in any order as long as the order is not particularly indicated by "prior to," "before," or the like and as long as the output from a previous processing is not used in a later processing. Even if the operation flow is described using phrases such as "first" or "then" for convenience in the claims, the specification, and the drawings, it does not necessarily mean that the processing must be performed in this order.

What is claimed is:

1. A manufacturing method of a semiconductor device in which a semiconductor substrate comprises a first impurity and the semiconductor substrate is irradiated with a charged particle beam, the manufacturing method comprising:

performing an analysis method for analyzing a defect rate of the semiconductor device, the analysis method comprising:

acquiring measurement values of a characteristic of a plurality of the semiconductor devices in each of one or more measurement groups, wherein a concentration of the first impurity and an irradiation amount of the charged particle beam used in producing the plurality of the semiconductor devices in any one of the one or more measurement groups are from a corresponding set range included in a plurality of set ranges;

generating a measurement distribution showing a probability distribution, for each of the one or more measurement groups, of the measurement values of the characteristic or a probability distribution, for each of the one or more measurement groups, of converted measurement values obtained by mathematically converting the measurement values of the characteristic such that the probability distribution of the converted measurement values at least approximates a normal distribution;

generating a virtual distribution in which samples of the characteristic are distributed in a range that is wider than the measurement distribution by simulating, based on the measurement distribution, the characteristic of a corresponding one of a plurality of virtual groups of semiconductor devices; and calculating a defect rate in the virtual distribution;

designing the semiconductor device by determining, based on the defect rate in each of the plurality of set ranges calculated with the analysis method, the irradiation amount of the charged particle beam against the semiconductor substrate to be used for subsequent manufacture of the semiconductor device; and manufacturing the semiconductor device by irradiating the semiconductor substrate with the charged particle beam of the irradiation amount determined in the designing.

2. The manufacturing method according to claim 1, wherein the generating the virtual distribution comprises generating the virtual distribution based on a probability of occurrence of each value of the characteristic in the measurement distribution.

3. The manufacturing method according to claim 2, wherein the generating the virtual distribution comprises generating the virtual distribution for each of the plurality of set ranges that has a corresponding one of the one or more measurement groups by using the probability of occurrence of each value of the characteristic in the measurement distribution for the corresponding one of the one or more measurement groups.

4. The manufacturing method according to claim 2, wherein the generating the virtual distribution comprises generating the virtual distribution for at least each of the plurality of the set ranges that does not have a corresponding one of the one or more measurement groups by using the probability of occurrence of each value of the characteristic in the measurement distribution of a same representative one of the one or more measurement groups.

5. The manufacturing method according to claim 1, further comprising:

generating, by acquiring group representative values of the characteristic in a plurality of the measurement groups having the same corresponding set range for each of the measurement groups, a measurement group distribution showing a probability distribution of the group representative values, wherein the generating the virtual distribution comprises generating the virtual distribution based on at least the measurement group distribution.

6. The manufacturing method according to claim 5, wherein the generating the virtual distribution comprises generating the virtual distribution for the corresponding set range that is the same as the corresponding set range of the plurality of measurement groups.

7. The manufacturing method according to claim 6, further comprising:

generating a virtual group by generating, based on the measurement group distribution, a plurality of virtual groups for the corresponding set range that is the same as the corresponding set range of the plurality of measurement groups, wherein the generating the virtual distribution comprises generating a plurality of virtual distributions by applying the measurement distribution for each of the plurality of measurement groups with the group representative value of each of the plurality of virtual groups as a reference such that each of the plurality of virtual distributions is distributed about the group representative value of a corresponding one of the plurality of virtual groups.

8. The manufacturing method according to claim 5, wherein the generating the virtual distribution comprises generating the virtual distribution for each of the set ranges, and the calculating the defect rate comprises calculating the defect rate for each of the set ranges by using the virtual distribution corresponding to each of the set ranges.

9. The manufacturing method according to claim 8, further comprising:

generating, by acquiring a distribution representative value representing a representative value of each of the measurement group distributions, a relationship information indicating a relationship between a value of the set range and the distribution representative value; and generating, based on the relationship information, a virtual group distribution for the set range that is different from the measurement group distribution, wherein the generating the virtual distribution comprises generating the virtual distribution for each of the set ranges by using the virtual group distribution corresponding to each of the set ranges, and the calculating the defect rate comprises calculating the defect rate of the set range corresponding to the virtual group distribution.

10. The manufacturing method according to claim 9, further comprising:

acquiring a shape information indicating a shape of each of the measurement group distributions, wherein the generating the virtual group distribution comprises generating the virtual group distribution further based on the shape information.

11. The manufacturing method according to claim 1, wherein the calculating the defect rate comprises calculating the defect rate for the characteristic, for each of the set ranges.

12. The manufacturing method according to claim 1, wherein the acquiring the measurement values comprises acquiring a first characteristic and a second characteristic as the characteristic of the semiconductor device, the generating the measurement distribution comprises generating the measurement distribution showing a probability distribution, for each of the one or more measurement groups, of the measurement values of the first characteristic and the second characteristic, and the generating the virtual distribution comprises generating the virtual distribution in which samples of the first characteristic and the second characteristic are distributed in a range that is wider than the measurement distribution by simulating, based on the measurement distribution, the first characteristic and the second characteristic of a corresponding one of a plurality virtual groups of semiconductor devices.

13. The manufacturing method according to claim 12, wherein the generating the virtual distribution comprises generating the virtual distribution based on a covariance of the first characteristic and the second characteristic in the measurement distribution.

14. The manufacturing method according to claim 13, wherein the generating the virtual distribution comprises generating the virtual distribution for each of the plurality of set ranges that has a corresponding one of the one or more measurement groups by using the covariance of the first characteristic and the second characteristic in the measurement distribution for the corresponding one of the one or more measurement groups.

15. The manufacturing method according to claim 13, wherein the generating the virtual distribution comprises generating the virtual distribution for at least each of the plurality of the set ranges that does not have a corresponding one of the one or more measurement groups by using the covariance of the first characteristic and the second characteristic in the measurement distribution of a same representative one of the one or more measurement groups.

16. The manufacturing method according to claim 12, further comprising:

generating, by acquiring group representative values of the first characteristic and the second characteristic in a plurality of the measurement groups having the same corresponding set range for each of the measurement groups, a measurement group distribution showing a probability distribution of the group representative values, wherein the generating the virtual distribution comprises generating the virtual distribution based on at least the measurement group distribution.

17. The manufacturing method according to claim 12, wherein the calculating the defect rate comprises calculating the defect rate for each of the first characteristic and the second characteristic, for each of the set ranges.

18. The manufacturing method according to claim 17, wherein the calculating the defect rate comprises regarding, in each of the set ranges, a higher one of the defect rate of the first characteristic and the defect rate of the second characteristic as the defect rate of each of the set ranges.

19. The manufacturing method according to claim 1, wherein the calculating the defect rate comprises calculating an average defect rate of the semiconductor device based on a value obtained by multiplying a probability of the concentration of the first impurity in the semiconductor substrate and the irradiation amount of the charged particle beam falling within each of the set ranges by the defect rate in each of the set ranges.

20. The manufacturing method according to claim 19, further comprising:

designing the semiconductor device by determining the irradiation amount of the charged particle beam based on the concentration of the first impurity in the semiconductor substrate used for manufacture of the semiconductor device and on a characteristic that should be possessed by the semiconductor device; and calculating the average defect rate of the semiconductor device based on the irradiation amount of the charged particle beam determined in the designing.

21. The manufacturing method according to claim 1, wherein the first impurity is carbon, and the charged particle beam is a helium ion.

22. A non-transitory, computer-readable storage medium having stored therein a program that when executed by a computer causes the computer to perform an analysis method of analyzing a defect rate of a semiconductor device that includes a semiconductor substrate comprising a first impurity, the semiconductor substrate to be irradiated with a charged particle beam during manufacture of the semiconductor device, the analysis method comprising:

acquiring measurement values of a characteristic of a plurality of the semiconductor devices in each of one or more measurement groups, wherein a concentration of the first impurity and an irradiation amount of the charged particle beam used in producing the plurality of the semiconductor devices in any one of the one or more measurement groups are from a corresponding set range included in a plurality of set ranges;

generating a measurement distribution showing a probability distribution, for each of the one or more measurement groups, of the measurement values of the characteristic or a probability distribution, for each of the one or more measurement groups, of converted measurement values obtained by mathematically converting the measurement values of the characteristic such that the probability distribution of the converted measurement values at least approximates a normal distribution;

generating a virtual distribution in which samples of the characteristic are distributed in a range that is wider than the measurement distribution by simulating, based on the measurement distribution, the characteristic of a corresponding one of a plurality of virtual groups of semiconductor devices; and calculating a defect rate in the virtual distribution, wherein the defect rate in each of the plurality of set ranges calculated with the analysis method enables determination of the irradiation amount of the charged particle beam against the semiconductor substrate to be used for subsequent manufacture of the semiconductor device.

\* \* \* \* \*